US008468439B2

(12) United States Patent
Kirkpatrick

(10) Patent No.: US 8,468,439 B2
(45) Date of Patent: Jun. 18, 2013

(54) SPEED-OPTIMIZED COMPUTATION OF CYCLIC REDUNDANCY CHECK CODES

(75) Inventor: Donald C. Kirkpatrick, Beaverton, OR (US)

(73) Assignee: Nexus Technology, Inc., Nashua, NH (US)

( * ) Notice: Subject to any disclaimer, the term of this patent is extended or adjusted under 35 U.S.C. 154(b) by 175 days.

(21) Appl. No.: 13/134,325

(22) Filed: Jun. 2, 2011

(65) Prior Publication Data

US 2012/0311411 A1 Dec. 6, 2012

(51) Int. Cl.
*H03M 13/00* (2006.01)
*H03M 13/03* (2006.01)
*G11C 29/00* (2006.01)
*G06F 11/00* (2006.01)

(52) U.S. Cl.
USPC ........... 714/807; 714/758; 714/766; 714/776; 714/794; 714/799; 714/800

(58) Field of Classification Search
USPC ................. 714/807, 758, 766, 776, 794, 799, 714/800
See application file for complete search history.

(56) References Cited

U.S. PATENT DOCUMENTS

| 6,122,670 | A * | 9/2000 | Bennett et al. ............. 709/236 |
| 6,345,302 | B1 * | 2/2002 | Bennett et al. ............. 709/236 |
| 6,964,008 | B1 * | 11/2005 | Van Meter, III ............. 714/807 |
| 7,003,702 | B2 * | 2/2006 | Budd et al. ....................... 714/52 |
| 7,103,821 | B2 * | 9/2006 | Lakshmanamurthy et al. ............................. 714/758 |
| 7,185,266 | B2 * | 2/2007 | Blightman et al. ........... 714/776 |
| 7,941,662 | B2 * | 5/2011 | Tardo et al. .................... 713/168 |
| 2008/0040519 | A1 * | 2/2008 | Starr et al. ....................... 710/39 |

\* cited by examiner

*Primary Examiner* — John J Tabone, Jr.
(74) *Attorney, Agent, or Firm* — Portland Intellectual Property, LLC

(57) ABSTRACT

Apparatus and methods for generating checksums may process two or more segments of a message in parallel, and may be used with a communications channel having time slots. An apparatus may include a cumulative checksum generator to generate a cumulative checksum for a message, a partial checksum generator to generate one or more partial checksums from one or more respective message segments, and a speculative checksum generator to generate a speculative checksum for each of one or more time slots. In one aspect, a partial checksum corresponding with an initial segment of the message may be generated from at least an initialization vector. A speculative checksum selector may select a first speculative checksum for use in determining whether the message was transmitted without error. The generating of partial and speculative checksums results in a maximally pipe-lined architecture with speed limited only by a minimal cumulative CRC calculation that is fundamentally unavoidable.

40 Claims, 19 Drawing Sheets

|      | X0 | X1 | X2 | X3 | X4 | X5 | X6 | X7 | X8 | X9 | X10 | X11 | X12 | X13 | X14 | X15 |
|------|----|----|----|----|----|----|----|----|----|----|-----|-----|-----|-----|-----|-----|
| X'0  |    |    |    |    | x  | x  |    | x  |    |    |     |     | x   |     |     |     |
| X'1  |    |    |    |    |    | x  | x  |    | x  |    |     |     |     | x   |     |     |
| X'2  |    |    |    |    |    |    | x  | x  |    | x  |     |     |     |     | x   |     |
| X'3  | x  |    |    |    |    | x  | x  |    |    | x  |     |     |     |     |     | x   |
| X'4  | x  | x  |    |    | x  | x  |    |    | x  |    |     |     |     |     |     |     |
| X'5  |    | x  | x  |    |    | x  | x  |    |    | x  |     |     |     |     |     |     |
| X'6  | x  |    | x  | x  |    |    | x  | x  |    |    |     | x   |     |     |     |     |
| X'7  | x  | x  |    | x  | x  |    |    | x  | x  |    |     |     | x   |     |     |     |
| X'8  | x  | x  | x  |    | x  | x  |    |    | x  | x  |     |     |     | x   |     |     |
| X'9  |    | x  | x  | x  |    | x  | x  |    |    | x  | x   |     |     |     | x   |     |
| X'10 |    | x  | x  | x  |    | x  | x  |    |    | x  | x   |     |     |     |     | x   |
| X'11 | x  |    |    | x  |    |    | x  |    |    |    | x   |     |     |     |     |     |
| X'12 | x  | x  |    |    | x  |    |    |    | x  |    |     |     | x   |     |     |     |
| X'13 |    | x  | x  |    |    | x  |    |    |    | x  |     |     |     | x   |     |     |
| X'14 |    |    | x  | x  |    |    | x  |    |    |    | x   |     |     |     | x   |     |
| X'15 |    |    |    | x  | x  |    |    | x  |    |    |     | x   |     |     |     | x   |

| d3 | d2 | d1 | d0 | CUMULATIVE CHECKSUM (C) |
|---|---|---|---|---|
| | | | | c |
| 0 | 0 | 0 | 1 | $16\{\sim bop[0]\} \cdot (M^2 \times c) + e0$ |
| 0 | 0 | 1 | 0 | $16\{\sim bop[1]\} \cdot (M^2 \times c) + e1$ |
| 0 | 0 | 1 | 1 | $16\{\sim bop[0]\} \cdot (M^4 \times c) + (M^2 \times e0) + e1$ |
| 0 | 1 | 0 | 0 | $16\{\sim bop[2]\} \cdot (M^2 \times c) + e2$ |
| 0 | 1 | 0 | 1 | $16\{\sim\{bop[2], bop[0]\}\} \cdot (M^4 \times c) + 16\{\sim bop[2]\} \cdot (M^2 \times e0) + e2$ |
| 0 | 1 | 1 | 0 | $16\{\sim bop[1]\} \cdot (M^4 \times c) + (M^2 \times e1) + e2$ |
| 0 | 1 | 1 | 1 | $16\{\sim bop[0]\} \cdot (M^6 \times c) + (M^2 \times e1) + e2$ |
| 1 | 0 | 0 | 0 | $16\{\sim bop[3]\} \cdot (M^2 \times c) + e3$ |
| 1 | 0 | 0 | 1 | $16\{\sim\{bop[3], bop[0]\}\} \cdot (M^4 \times c) + 16\{\sim bop[3]\} \cdot (M^2 \times e0) + e3$ |
| 1 | 0 | 1 | 0 | $16\{\sim\{bop[3], bop[1]\}\} \cdot (M^4 \times c) + 16\{\sim bop[3]\} \cdot (M^2 \times e1) + e3$ |
| 1 | 0 | 1 | 1 | $16\{\sim\{bop[3], bop[0]\}\} \cdot (M^6 \times c) + 16\{\sim bop[3]\} \cdot ((M^4 \times e0) + (M^2 \times e1)) + e3$ |
| 1 | 1 | 0 | 0 | $16\{\sim bop[2]\} \cdot (M^4 \times c) + (M^2 \times e2) + e3$ |
| 1 | 1 | 0 | 1 | $16\{\sim\{bop[2], bop[0]\}\} \cdot (M^6 \times c) + 16\{\sim bop[2]\} \cdot (M^4 \times e0) + (M^2 \times e2) + e3$ |
| 1 | 1 | 1 | 0 | $16\{\sim bop[1]\} \cdot (M^6 \times c) + (M^4 \times e1) + (M^2 \times e2) + e3$ |
| 1 | 1 | 1 | 1 | $16\{\sim bop[0]\} \cdot (M^8 \times c) + (M^6 \times e0) + (M^4 \times e1) + (M^2 \times e2) + e3$ |

*FIG. 8*

| d3 | d2 | d1 | d0 | SPECULATIVE CHECKSUM |
|---|---|---|---|---|
| 0 | 0 | 0 | 0 | crc0 <= c |
| 0 | 0 | 0 | 0 | crc1 <= c |
| 0 | 0 | 0 | 0 | crc2 <= c |
| 0 | 0 | 0 | 0 | crc3 <= c |
| 0 | 0 | 0 | 1 | crc0 <= not necessary code |
| 0 | 0 | 0 | 1 | crc1 <= 16{~bop[0]} · (M$^2$ x c) + e0 |
| 0 | 0 | 0 | 1 | crc2 <= 16{~bop[0]} · (M$^2$ x c) + e0 |
| 0 | 0 | 0 | 1 | crc3 <= 16{~bop[0]} · (M$^2$ x c) + e0 |
| 0 | 0 | 1 | 0 | crc0 <= c |
| 0 | 0 | 1 | 0 | crc1 <= 16{~bop[1]} · (M$^2$ x c) + e1 |
| 0 | 0 | 1 | 0 | crc2 <= 16{~bop[1]} · (M$^2$ x c) + e1 |
| 0 | 0 | 1 | 0 | crc3 <= 16{~bop[1]} · (M$^2$ x c) + e1 |
| 0 | 0 | 1 | 1 | crc0 <= not necessary code |
| 0 | 0 | 1 | 1 | crc1 <= not necessary code |
| 0 | 0 | 1 | 1 | crc2 <= 16{~bop[0]} · (M$^4$ x c) + (M$^2$ x e0) + e1 |
| 0 | 0 | 1 | 1 | crc3 <= 16{~bop[0]} · (M$^4$ x c) + (M$^2$ x e0) + e1 |

*FIG. 9A*

| d3 | d2 | d1 | d0 | SPECULATIVE CHECKSUM |
|---|---|---|---|---|
| 0 | 1 | 0 | 0 | crc0 <= c |
| 0 | 1 | 0 | 0 | crc1 <= c |
| 0 | 1 | 0 | 0 | crc2 <= not necessary code |
| 0 | 1 | 0 | 0 | crc3 <= 16{~bop[2]} · ($M^2$ x c) + e2 |
| 0 | 1 | 0 | 1 | crc0 <= not necessary code |
| 0 | 1 | 0 | 1 | crc1 <= 16{~bop[0]} · ($M^2$ x c) + e0 |
| 0 | 1 | 0 | 1 | crc2 <= not necessary code |
| 0 | 1 | 0 | 1 | crc3 <= 16{~{bop[2], bop[0]}} · ($M^4$ x c) + 16{~bop[2]} · ($M^2$ x e0) + e2 |
| 0 | 1 | 1 | 0 | crc0 <= c |
| 0 | 1 | 1 | 0 | crc1 <= not necessary code |
| 0 | 1 | 1 | 0 | crc2 <= not necessary code |
| 0 | 1 | 1 | 0 | crc3 <= 16{~bop[1]} · ($M^4$ x c) + ($M^2$ x e1) + e2 |
| 0 | 1 | 1 | 1 | crc0 <= not necessary code |
| 0 | 1 | 1 | 1 | crc1 <= not necessary code |
| 0 | 1 | 1 | 1 | crc2 <= not necessary code |
| 0 | 1 | 1 | 1 | crc3 <= 16{~bop[0]} · ($M^6$ x c) + ($M^4$ x e0) + ($M^2$ x e1) + e2 |

*FIG. 9B*

| d3 | d2 | d1 | d0 | SPECULATIVE CHECKSUM |
|----|----|----|----|----------------------|
| 1  | 0  | 0  | 0  | crc0 <= c |
| 1  | 0  | 0  | 0  | crc1 <= c |
| 1  | 0  | 0  | 0  | crc2 <= c |
| 1  | 0  | 0  | 0  | crc3 <= not necessary code |
| 1  | 0  | 0  | 1  | crc0 <= not necessary code |
| 1  | 0  | 0  | 1  | crc1 <= 16{~bop[0]} · ($M^2$ x c) + e0 |
| 1  | 0  | 0  | 1  | crc2 <= 16{~bop[0]} · ($M^2$ x c) + e0 |
| 1  | 0  | 0  | 1  | crc3 <= not necessary code |
| 1  | 0  | 1  | 0  | crc0 <= c |
| 1  | 0  | 1  | 0  | crc1 <= not necessary code |
| 1  | 0  | 1  | 0  | crc2 <= 16{~bop[1]} · ($M^2$ x c) + e1 |
| 1  | 0  | 1  | 0  | crc3 <= not necessary code |
| 1  | 0  | 1  | 1  | crc0 <= not necessary code |
| 1  | 0  | 1  | 1  | crc1 <= not necessary code |
| 1  | 0  | 1  | 1  | crc2 <= 16{~bop[0]} · ($M^4$ x c) + ($M^2$ x e0) + e1 |
| 1  | 0  | 1  | 1  | crc3 <= not necessary code |

FIG. 9C

| d3 | d2 | d1 | d0 | SPECULATIVE CHECKSUM |
|---|---|---|---|---|
| 1 | 1 | 0 | 0 | crc0 <= c |
| 1 | 1 | 0 | 0 | crc1 <= c |
| 1 | 1 | 0 | 0 | crc2 <= not necessary code |
| 1 | 1 | 0 | 0 | crc3 <= not necessary code |
| 1 | 1 | 0 | 1 | crc0 <= not necessary code |
| 1 | 1 | 0 | 1 | crc1 <= 16{~bop[0]} · ($M^2$ x c) + e0 |
| 1 | 1 | 0 | 1 | crc2 <= not necessary code |
| 1 | 1 | 0 | 1 | crc3 <= not necessary code |
| 1 | 1 | 1 | 0 | crc0 <= not necessary code |
| 1 | 1 | 1 | 0 | crc1 <= not necessary code |
| 1 | 1 | 1 | 0 | crc2 <= not necessary code |
| 1 | 1 | 1 | 0 | crc3 <= not necessary code |
| 1 | 1 | 1 | 1 | crc0 <= not necessary code |
| 1 | 1 | 1 | 1 | crc1 <= not necessary code |
| 1 | 1 | 1 | 1 | crc2 <= not necessary code |
| 1 | 1 | 1 | 1 | crc3 <= not necessary code |

FIG. 9D

SPEED-OPTIMIZED COMPUTATION OF CYCLIC REDUNDANCY CHECK CODES

FIELD

This disclosure relates to detecting message transmission errors in a communications channel and, in particular, to speed-optimized computation of cyclic redundancy check codes.

BACKGROUND

Digital data is transmitted in a wide variety of different contexts ranging from data transfers between nodes in a network to data transfers between a host and a memory in a computer system. With transmission rates increasing and voltage levels decreasing, the likelihood of an error occurring when data is transmitted can be significant. Detecting transmission errors is critical. One technique for detecting transmission errors is the cyclic redundancy check ("CRC").

The mathematics on which CRC techniques are based is the Galois or Finite Field theory. According to theory, all operations performed in a finite field result in an element within that field. The CRC technique is based on a field containing only two elements, i.e., GF(2): $\{0, 1\}$. Arithmetic is modulo(2). In modulo(2), addition and subtraction operations are equivalent to a bitwise XOR operation. Multiplication is equivalent to a bitwise AND operation. Long division, which requires one or more subtractions, may be performed using bitwise XOR operations. In CRC techniques, bits of data are represented by polynomials, which are a function of a dummy variable "x" and have coefficients that are either 0 or 1. For example, the bits 1011 may be represented by $1 \cdot x^3 + 0 \cdot x^2 + 1 \cdot x + 1$.

When a CRC technique is used, the message or information bits are transmitted along with a CRC code. The CRC code (also referred to as a "CRC" or "checksum") is typically appended to the end of the message. The CRC code is determined by dividing the message polynomial by a generator polynomial using polynomial division in GF(2). The remainder is the CRC. In general, the message polynomial may be any length, but the CRC is always a fixed length equal to the length of the generator polynomial. A variety of generator polynomials are available. Historically, a shift register configured with feedback according to the generator polynomial has been used to calculate CRC codes. The message is input serially to the linear feedback shift register (LFSR), one bit per clock. After the entire message has been input, the value stored in the LFSR is the remainder or CRC code.

A receiver determines whether the message has been received without error by dividing the generator polynomial into the message polynomial (and appended CRC). Generally, if the remainder is zero, there is a high likelihood that the message has been received without transmission error. The CRC code may be stripped from the received message and the data processed or stored. On the other hand, if the remainder is not equal to zero, the received message includes a transmission error and appropriate action may be initiated, e.g., request re-transmission.

To compute a CRC code for a message to be transmitted or to check a received message for a transmission error using an LFSR, one clock cycle for each bit of the message is required. Because an LFSR processes information bits serially, this approach is generally too slow to handle the high data transmission speeds used in many networks and busses.

It is known to compute CRCs using a network of exclusive OR gates instead of a LFSR. When an XOR network is used, two or more bits of a message are input in parallel to the network. FIG. 1 illustrates an example in which 16 bits (d00-d15) are input in parallel. Typically, the number of bits input in parallel is equal to the degree of the generator polynomial. The process is iterative. Groups of bits are repeatedly input to the XOR network to produce intermediate results until the entire message has been input. Intermediate results are repeatedly fed back to be added to the next group of bits. As the number of bits that are input in parallel increases, however, the XOR network increases in complexity and depth, which in turn increases the time required for a signal to propagate through the network. In addition, each new group of bits must be XORed with a previous intermediate result before being input to the XOR network, further increasing the time required to compute intermediate results. While known approaches for parallel computation of CRC codes are able to handle the transmission speeds used in some networks and busses, transmission speeds are increasing further and the known approaches are too slow to handle the high data transmission speeds in many modern networks and busses. Accordingly, there is a need for speed-optimized circuits and methods for computation of cyclic redundancy check codes.

SUMMARY

Apparatus and methods for speed-optimized generation of cyclic redundancy check codes are described herein. One aspect is directed to an apparatus for generating checksums, which may be used for detecting message transmission errors in a communications channel. The communications channel has time slots for transmitting units of data. The messages have one or more message segments. The apparatus may include a cumulative checksum generator generates a cumulative checksum for a message. The cumulative checksum generator may include a selecting part to select one or more inputs to include in the cumulative checksum, a state determining part to determine the number of states to advance an input selected for inclusion in the cumulative checksum, an input vector generating part to generate an input vector for each input selected for inclusion in the cumulative checksum, and a superposition part to superimpose the input vectors. The inputs may be selected from a previously generated cumulative checksum and one or more partial checksums.

The apparatus may include a partial checksum generator to generate the one or more partial checksums from one or more respective message segments. In one embodiment, the one or more partial checksums includes four partial checksums.

In one aspect, a partial checksum corresponding with an initial segment of the message may be generated from at least an initialization vector. The initialization vector may be generated by superimposing the initial segment and an initialization value.

In another aspect, each partial checksum is generated from a corresponding m-bit message segment of the message by generating a first component vector by advancing a first component of the message by n states, generating a second component vector by advancing a second component of the message by m states, and superimposing the first and second component vectors, m being equal to an integer multiple of n.

The apparatus may include a speculative checksum generator to generate a speculative checksum for each of one or more time slots. Each unit of data is one of a message data unit or a non-message data unit. The speculative checksum generator may include a selecting component to select one or more inputs to include in the speculative checksum, a state determining component to determine the number of states to advance an input selected for inclusion in the speculative checksum, a generating component to generate a speculative input vector for each input selected for inclusion in the speculative checksum by advancing the selected input by the determined number of states, and a superimposing component to superimpose the speculative input vectors. The inputs may be selected from the previously generated cumulative checksum and the one or more partial checksums.

The apparatus may include a speculative checksum selector to select a first speculative checksum for use in determining whether the message was transmitted without error if the first speculative checksum was generated for a time slot following a final segment of a message.

One aspect is directed to a method for detecting message transmission errors in a communications channel having time slots for transmitting units of data. The messages have one or more message segments and the method includes generating a cumulative checksum for a message. The generating of the cumulative checksum may include selecting one or more inputs to include in the cumulative checksum, determining the number of states to advance an input selected for inclusion in the cumulative checksum, generating an input vector for each selected input, and superimposing the input vectors. The inputs may be selected from a previously generated cumulative checksum and one or more partial checksums.

The method may include generating one or more partial checksums. In one embodiment, the one or more partial checksums includes four partial checksums.

One aspect is directed to generating a partial checksum corresponding with an initial segment of the message from an initialization vector, although a partial checksum corresponding with an initial segment may be generated from data in addition to the initialization vector. The initialization vector may be generated by superimposing the initial segment and an initialization value.

Another aspect is directed to generating the one or more partial checksums from one or more respective message segments. The cumulative checksum is n bits. Each partial checksum is n bits and is generated from a corresponding m-bit segment of the message by advancing the segment by m states, m being equal to an integer multiple of n.

In one embodiment, the method may include receiving the message and a checksum generated for the message from the communications channel. In one embodiment, the method may include transmitting the message and a checksum generated for the message in the communications channel.

The method may include generating a speculative checksum for each of one or more time slots. Each unit of data is one of a message data unit or non-message data unit. The generating of a speculative checksum may include selecting one or more inputs to include in the speculative checksum determining the number of states to advance an input selected for inclusion in the speculative checksum, generating a speculative input vector for each selected input, and superimposing the speculative input vectors. The inputs may be selected from the previously generated cumulative checksum and the one or more partial checksums.

One aspect is of the method is directed to selecting a first speculative checksum for use in determining whether the message was transmitted without error if the first speculative checksum was generated for a time slot following a final segment of a message.

BRIEF DESCRIPTION OF FIGURES

FIG. 8 shows a table illustrating the generation of a cumulative checksum for a variety of different cases of valid inputs according to one embodiment.
FIGS. 9A-D show a table illustrating the generation of a speculative checksums for a variety of different cases of valid inputs according to one embodiment.

DETAILED DESCRIPTION

The present disclosure describes speed-optimized techniques for computation of cyclic redundancy check codes. The CRC techniques are described in the context of an industry specification for data communications known as Serial Rapid IO ("SRIO"). In addition, the context in which the techniques are described generally pertains to checking a message received from a communications channel for transmission error. However, this is for purposes of illustration only as the described techniques are equally applicable in other contexts. The disclosed techniques may be employed to determine a CRC for a message to be transmitted. In addition, the techniques may be used in wired, wireless, or optical fiber communication channels. As several non-limiting examples, the disclosed techniques may be used with a receiver or a transmitter in applications that are based on the Asynchronous Transfer Mode, Ethernet, WiFi, WiMax, and Universal Serial Bus standards.

SRIO

SRIO is a packet-based standard that may be used to connect devices with one another. In one embodiment, a bus employing the SRIO or other protocol may couple a processor and a memory. Presently, SRIO may include one, two, four, eight, or sixteen LVDS (low voltage differential signaling) serial busses, which the specification refers to as "lanes." SRIO is specified as a three-layer stack having physical, transport, and logical layers. The logical layer defines the overall protocol and packet formats. All packets include various header fields followed by a data payload, i.e., a message, and a CRC code. The header fields include a start of packet ("sop") symbol. The length of the payload in a SRIO packet is variable. A SRIO message is a multiple of one double word (4 bytes), ranging from 1 to 64 double words. The CRC code is always two bytes and follows the data payload. (A packet greater than 80 bytes includes two CRC codes, the first CRC being in byte positions 81 and 82.) The data payload and the CRC code together always total an integer multiple of a 32-bit message segment. Commonly, SRIO packets may be sent over a bus more or less continuously. When a packet or control symbol is not being transmitted, a sequence of characters (9-bit entities defined below) referred to as an "idle sequence" is transmitted. The receiver of a SRIO packet, however, does not know in advance the number of bytes of payload in a packet. The number of bytes of payload only becomes known to the receiver when it receives an end of packet ("eop") or a new sop symbol.

Figure 2:
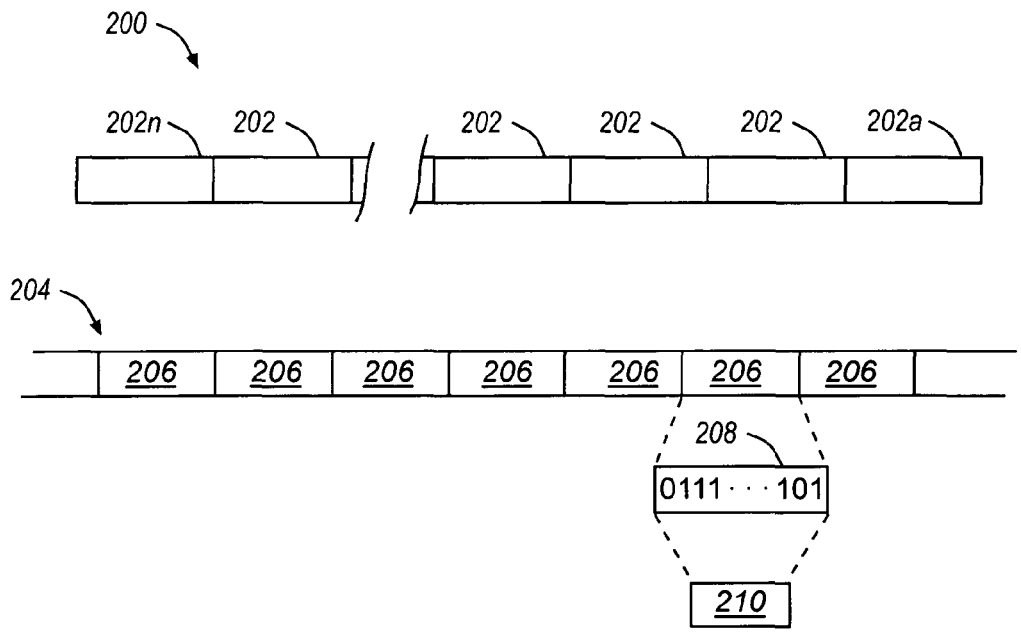
FIG. 2 illustrates a message having one or more segments.

As mentioned, the described techniques are not limited to SRIO. FIG. 2 shows a generic message 200, which may or may not conform to the SRIO protocol. A message may be divided into one or more "segments" 202. The message 200 may include a first segment 202a and a final segment 202n. The segments may be any desired length. The number of bits in a segment may be determined by the standard or protocol used. For an SRIO communications channel, a segment may be a double word (32 bits).

Figure 3A:
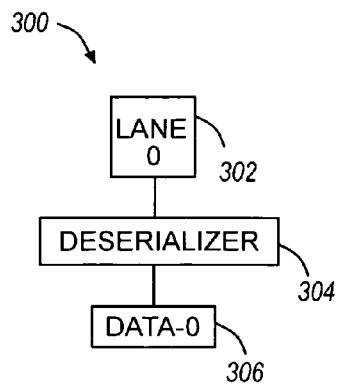
FIGS. 3A, 3B illustrate, respectively, portions of exemplary receivers.
Figure 3B:
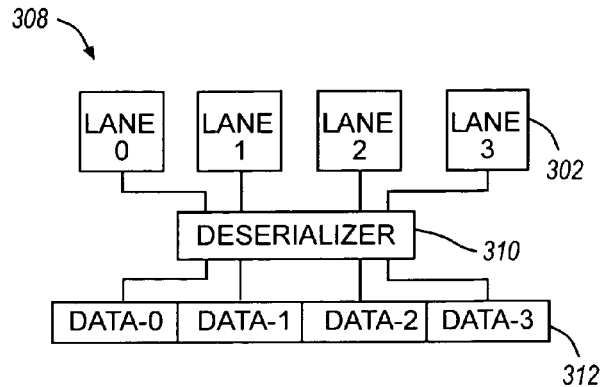

FIGS. 3A, 3B illustrate, respectively, portions of exemplary x1 and x4 SRIO receivers 300, 308. A character is transmitted serially on each lane 302. A character is a 9-bit entity consisting of a byte (8-bits) of information and a control bit that indicates whether the character contains data or control information. A serial-to-parallel interface (deserializers 304, 310) converts serially-received bits into characters. A "D-character" is an 8-bit data byte. The x1 SRIO receiver 300 may store a single D-character in memory 306 in each clock cycle (in the time domain of an apparatus for determining if a message is accurately received using a CRC technique). The x4 SRIO receiver 308 may store four D-characters in memory 312 in each clock cycle (in the time domain of an apparatus for determining if a message is accurately received using a CRC technique). One clock cycle in the time domain of a CRC determining apparatus according to the principles described herein may correspond with multiple clock cycles in the time domain of the communications channel. As one example, a CRC determining apparatus clock cycle may correspond with 160 communications channel clock cycles.

A communications channel conforming to the SRIO specification, as well as other communications channels in which the principles of the invention may be employed, may include a sequence of time slots. At any point in time, there may be not be a need to use the communications channel to transmit a message, in which case an idle sequence may be placed in one or more of the "time slots." Referring to FIG. 2, time slots 206 in communications channel 204 may include multiple bits 208. When a need arises to transmit a message, one or more control symbols related to the message as well as the actual message data (data payload and CRC) may be placed in one or more time slots. An idle sequence and control symbols may be considered to be examples of non-message data, while the actual message may be considered to be message data. Accordingly, each of the time slots of a communication channel may have an associated unit of data, e.g., the bits 208, and a data unit 210 may be either a non-message data unit, i.e., idle or control information, or all or a portion of a message.

Figure 4A:
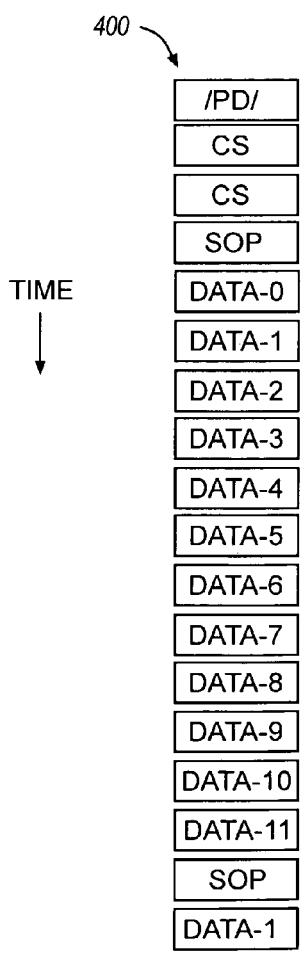
FIGS. 4A, 4B illustrate, respectively, an exemplary packet and exemplary data flows for the receivers of FIGS. 3A, 3B.
Figure 4B:
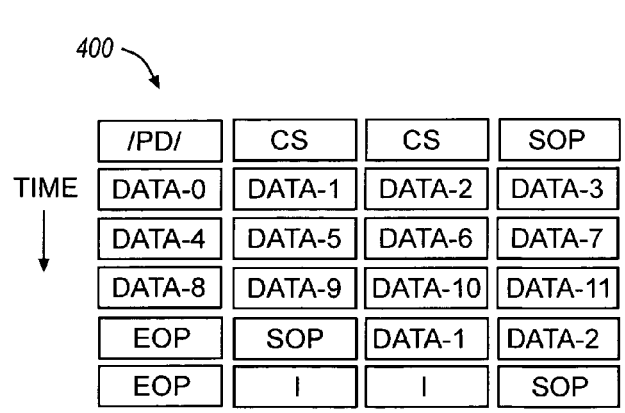

FIGS. 4A, 4B illustrate, respectively, an exemplary packet and exemplary data flows for the x1 and x4 SRIO receivers 300, 308. The characters 400 labeled PD, CS, SOP, EOP, and I are control characters that indicate, respectively, a packet delimiter, control symbol, start of packet symbol, end of packet symbol, and idle symbol. The characters 400 labeled "DATA-N" represent D-characters. Note that the appended CRC code may be a D-character. For example, D-10 and D-11 may be the CRC code for the exemplary packet.

Figure 1:
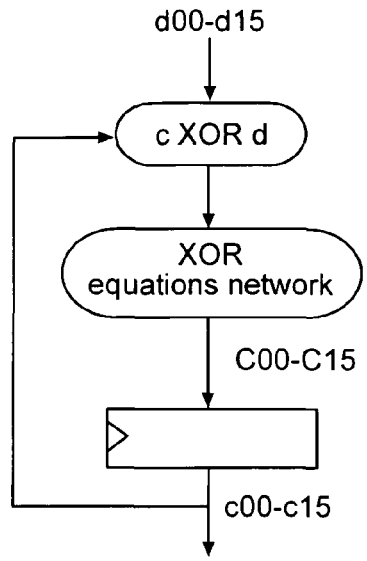
FIG. 1 illustrates a known circuit for calculation of a CRC.

SRIO specifies that in some circumstances packets are to be protected by a 16-bit CRC code generated using the ITU polynomial $x^{16}+x^{12}+x^{5}+1$. As noted above, messages may be long bit strings. When using an XOR logic network, such as that shown in FIG. 1, to determine a CRC code for a long bit string, or to determine if a long bit string has been accurately received, groups of bits are input in parallel until all of the bits have been input. Intermediate results are fed back and XORed with the next group of bits before the next group is input. In addition, the first group of bits may be initialized with an initialization polynomial, e.g., all logic 1's. In known methods, initialization may be performed by loading the register storing c00-c15 with the initialization value. The register must be reinitialized each time a new message is transmitted or received.

Each SRIO lane may operate at speeds up to 6.25 Giga bits per second. In SRIO, as well as under other bus standards, packets may be streamed on the bus one after another for long periods. As such, it is commonly required that intermediate values be computed at least as fast as the data is received.

Some embodiments for computation of cyclic redundancy check codes described below are specified for: (a) messages that are an integer multiple of 32-bit message segments; and (b) CRC calculations on a minimum of 16 bits of information, i.e., using a 16-bit generator polynomial. However, these specifications are not critical, as the described techniques are applicable to messages of sizes that are not a multiple of 32-bit message segments, and to CRC generator polynomials other than 16-bit polynomials. In addition, the techniques described below are applicable regardless of the number of lanes used. It is not critical whether data is received serially or in parallel. Further, some embodiments are described in a context in which the length of the message is not known to a receiver until the message is fully received. It is not critical, however, that the lengths of messages are not known in advance. In one embodiment, the length of the message may be provided to a receiver at the beginning of the message.

Parallel CRC Computations

A correspondence exists between the serial and parallel computations of a CRC code. This correspondence between serial and parallel approaches may be expressed in terms of the state of an LFSR implementing a generator polynomial. If an "n" bit message polynomial is input into a LFSR in n clock periods, then the state of the LFSR, i.e., the values stored in its registers, after the n clock cycles may be said to be the $n^{th}$ future state of the LFSR. If those same n bits of message are XORed with a previous intermediate result (or with an initialization polynomial) and the result is input in parallel into a network of XOR gates that implements the same generator polynomial as the LFSR, the network will output state values that are equal to the $n^{th}$ future state of the LFSR. The network, however, will generally output the state values in fewer than n clock cycles, e.g., in m clock cycles, where m is less than n.

In other words, the state values output by the XOR network after m clock cycles may be said to correspond with the state of the LFSR after n clocks cycles. This specification may describe parallel operations on data that generate a result which corresponds with the clocking of that data through an LFSR in a particular number of clock cycles, i.e., with a particular future state of the LFSR. Accordingly, in this description, the result of an operation may be referred to as corresponding with a particular state, advancing to a particular state, moving ahead to a particular state, determining of a particular future state, or other similar phrase or term.

The future state of an LFSR may be calculated using a generator "G" as shown in expression (1) below. In expression (1), the present state of the LFSR is given by X(n) and the next state is given by X(n+1). Expression (2) is the matrix form of expression (1). The first column of the (m×m) generator matrix G may contain the coefficients of a generator polynomial g(x). The other columns of the generator matrix G may contain 1's and 0's as shown in expression (2). More particularly, the top m rows of the columns of the generator matrix to the right of the first column contain an m−1 by m−1 identity matrix. In the bottom row of generator matrix, the columns of the to the right of the first column contain zeros. A next state is determined by multiplying the present state vector by the generator matrix G.

$$X(n+1) = G^y \times X(n), \text{ where} \quad (1)$$

$$\begin{bmatrix} x'0 \\ x'1 \\ x'2 \\ \ldots \\ x'_{m-2} \\ x'_{m-1} \end{bmatrix}_T = \begin{bmatrix} g0 & 1 & 0 & 0 & 0 & 0 \\ g1 & 0 & 1 & 0 & 0 & 0 \\ g2 & 0 & 0 & 1 & 0 & 0 \\ \ldots & \ldots & \ldots & \ldots & \ldots & \ldots \\ g_{m-2} & 0 & 0 & 0 & 0 & 1 \\ g_{m-1} & 0 & 0 & 0 & 0 & 0 \end{bmatrix}^y \times \begin{bmatrix} x0 \\ x1 \\ x2 \\ \ldots \\ x_{m-2} \\ x_{m-1} \end{bmatrix}_T \quad (2)$$

When a present state vector X(n) is multiplied with the generator matrix $G^1$ (y=1), the next state X(n+1) corresponds with the next state of an LFSR after clocking in one bit of input. Other next states may be determined by increasing the power "y" of the generator matrix $G^y$. For example, if X(n) is multiplied with the generator matrix $G^2$, the next state X(n+1) corresponds with the next state of an LFSR after clocking in two bits. More generally, the particular future state that X(n+1) corresponds with is given by the power y of the generator matrix G.

Expression (2) may be implemented in hardware, e.g., as an XOR network, or in software. As an example, consider a generator polynomial g(x) of degree 16 and generator matrix where y=16. An XOR network may be provided which accepts 16 bits of data in parallel. The XOR network operates to multiply the input vector by the generator matrix of power 16, generating a future state X(n+1) that corresponds with a $16^{th}$ future state of an LFSR. In this example, the inputting of 16 bits in parallel to the XOR network may generate the $16^{th}$ future state of an LFSR in one clock cycle.

Figures 5, 6:
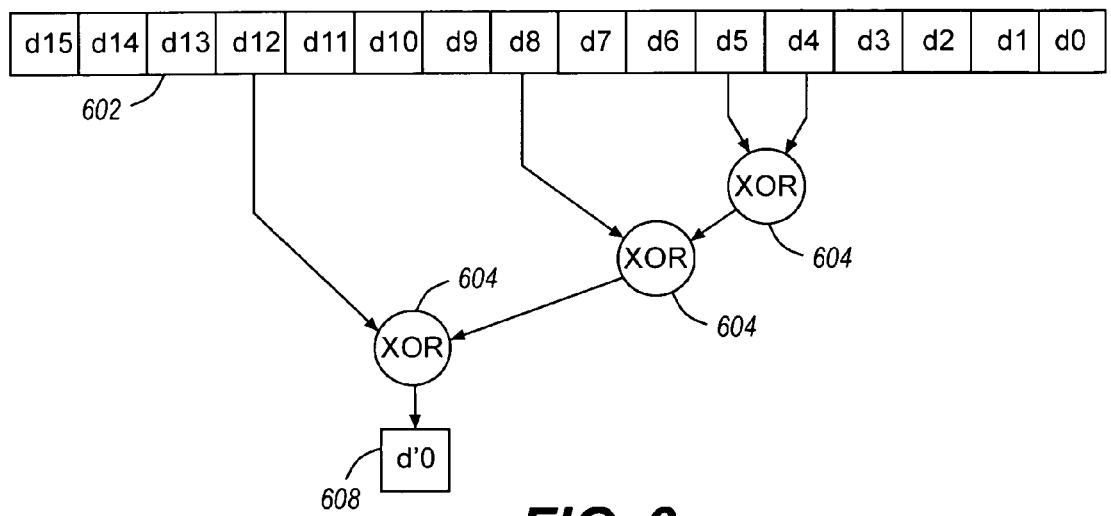
FIG. 5 shows a table defining XOR equations for an exemplary generator polynomial.
FIG. 6 illustrates a circuit implementing one of the XOR equations of the table of FIG. 5.

For the generator polynomial $x^{16}+x^{12}+x^5+1$, the XOR equations for processing 16 bits in parallel according to generator matrix $G^{16}$ are given in the table shown in FIG. 5. The top horizontal row of the table specifies the 16-bits that may be input in parallel. Combining the bits marked "x" for a particular row using XOR operations generates a bit of the next state value, which is listed in the left-most column of the row. For example, in the top row, the bit for (X'0) of X(n+1) equals X4⊕X5⊕X8⊕X12 of X(n). FIG. 6 illustrates a circuit implementing the XOR equation of this example. The circuit includes a register 602 for storing 16 bits of input, XOR gates 604, and an output register 606 for storing a first output bit corresponding with (X'0) of X(n+1). Note X'0 in FIG. 5 corresponds with d'0 in FIG. 6.

In this description, reference will be made to an exemplary intermediate matrix M, where $M=G^{16}$, the generator polynomial being $x^{16}+x^{12}+x^5+1$. The intermediate matrix M provides XOR equations that may be used to determine the $16^{th}$ state of an LFSR. In addition, in this description, reference may be made to matrices that are powers of M, i.e., $M^1=G^{16}$, $M^2=G^{32}$, $M^3=G^{48}$, and so on. Each increase in the power z of $M^z$ by 1 corresponds with moving the state of the LFSR ahead by 16 clocks. These matrices that are powers of M may be implemented in hardware or software.

Details of an Embodiment

Figure 7:
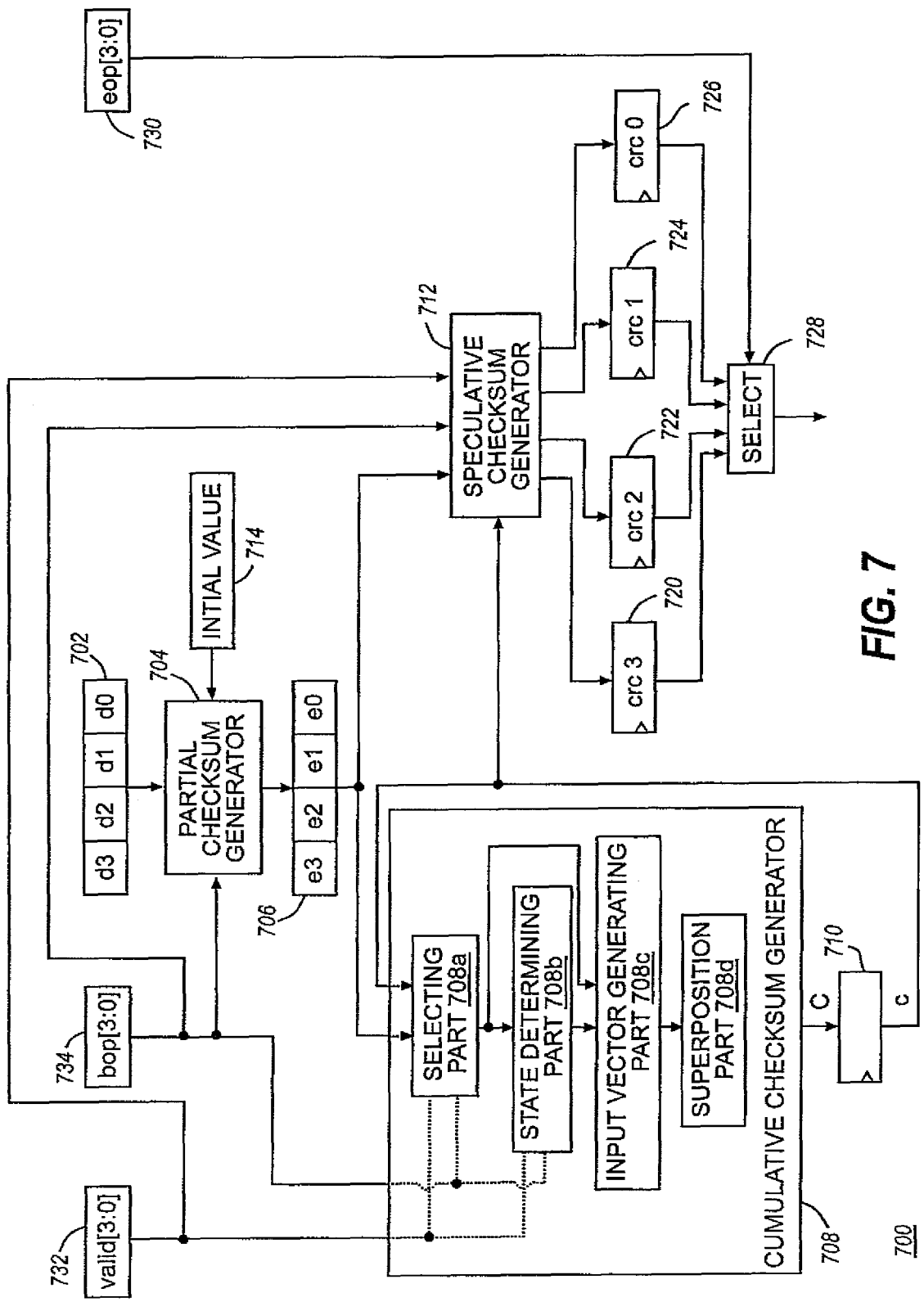
FIG. 7 is a block diagram of an apparatus for speed-optimized computation of CRC codes according to one embodiment.

FIG. 7 illustrates an embodiment of an apparatus 700 for speed-optimized computation of CRC codes. The exemplary apparatus 700 may process 128 bits of input data in parallel, computing CRC codes using any 16 degree generator polynomial, e.g., ITU polynomial $x^{16}+x^{12}+x^5+1$. Note that 128 bits is eight times the degree of the generator polynomial. The exemplary apparatus 700 may include a memory 702 for storing input data, a partial checksum generator 704 for generating partial checksums from the input data, and a memory 706 for storing the partial checksums. In addition, the apparatus 700 may include a cumulative checksum generator 708 for generating a cumulative checksum and a memory 710 for storing a cumulative checksum. Further, the apparatus 700 may include a speculative checksum generator 712 for generating one or more speculative checksums and memories 720, 722, 724, and 726 for storing speculative checksums or "not-necessary" codes. The apparatus 700 may also include a select unit 728 for selecting a speculative checksum as a CRC code for a particular message. Additionally, memories 730, 732, and 734 may be provided for storing eop, valid, and bop flags, respectively. The apparatus 700 may include "data status logic," not shown in FIG. 7, to generate the eop, valid, and bop flags for internal use by the apparatus. The eop, valid, and bop flags may be generated from eop, sop, and idle control symbols in the SRIO stream. A memory 714 may be provided with the apparatus 700 for storing an initialization value.

The exemplary apparatus 700 may include, or be included in, a transmitter (not shown) or a receiver (not shown) and may be coupled with a communications channel. Any suitable transmitter or receiver known to one of ordinary skill in the art may be provided. The communications channel may be a parallel or serial bus (not shown). As one example, the exemplary apparatus 700 may be coupled with a four lane SRIO bus. Data units may be sent over the bus more or less continuously. A data unit may be either a non-message data unit, or all or a portion of a message. Each data unit may be associated with a time slot of the communications channel. Data units may be stored in the memory 702 as they are received. In one embodiment, one data unit may be allocated per time slot of a SRIO lane. Accordingly, if the data unit is a segment of a message, one segment may be allocated per SRIO time slot. Note that an SIRO time slot, as used herein, may correspond with more than one SRIO bus clock cycle. In one embodiment, an SRIO time slot may correspond with a time period needed to transmit four characters, e.g., 32 or 40 bits. If the data received in a particular time slot is not message data, e.g. an eop or sop control symbol, or idle character data, the data status logic may set the valid flag for the data unit received in the time slot to "invalid." On the other hand, if the data received in a particular time slot is message data, the data status logic may set the valid flag to "valid." The data status logic may provide a valid-flag value for each data unit or time slot. In addition, the data status logic may provide may provide values for the eop and bop (beginning of packet) flags for each data unit or time slot to indicate whether the data unit in the time slot is a final or an initial segment of a message respectively. The bop flag is set to true (1) for the first message segment (e.g., double-word) following the time slot in which a sop control symbol is received. The data status logic sets the eop flag to true (1) for time slots in which the eop control symbol is received. The memories 730, 732, and 734 may store eop, valid, and bop signal values for one or more time slots. In one embodiment, the memories 730, 732, and 734 may store four eop, valid, and bop signal values, corresponding with four consecutive time slots or data units.

The memory 702 may store four data units d[0:31], d[32:63], d[64:95], and d[96:127], which in this description, may be abbreviated d0, d1, d2, and d3, respectively. Each data unit d0, d1, d2, and d3 includes a segment of a message if the data unit is marked as valid. Note that each data unit (32 bits) is two times the degree of the generator polynomial (16 bits) in one embodiment. The data units d0, d1, d2, and d3 may appear sequentially in the input data stream, e.g., with d0 appearing earlier and d3 appearing later. The data units d0, d1, d2, and d3 corresponding with four consecutive time slots may be referred to as a "group." If each of the four data units is a segment of a message, the four data units d0, d1, d2, and d3 may be referred to as a group of message segments. The segment d1 precedes the segment d2, but follows the segment d0, in the group. A particular group of data units d0, d1, d2, and d3 may include data segments of more than one message, as well as one or more non-message data units.

The partial checksum generator 704 may generate intermediate results from the group of data units stored in memory 702. The partial checksum generator 704 may be employed with or in a transmitter or in a receiver. For convenience, these intermediate results may be referred to in this description and in the claims as "partial checksums." This terminology notwithstanding, a partial checksum may be the CRC code for a message in one embodiment. For each data unit d0, d1, d2, and d3, the partial checksum generator 704 may generate a 16-bit partial checksum e0[0:15], e1[0:15], e2[0:15], and e3[0:15], respectively. With reference to the exemplary unit 700, the partial checksums may be abbreviated in this description as e0, e1, e2, and e3. A partial checksum may be generated from a like-numbered data unit, e.g., e0 may be determined from d0; e1 from d1; e2 from d2; and e3 from d3. In one embodiment, a partial checksum is generated from each data unit received from a communications channel even though a particular data unit may be invalid. As will be seen below, however, a partial checksum generated from an invalid data unit is not included as an input for generating a cumulative or speculative checksum. In an alternative embodiment, a partial checksum may be generated only for valid data units. Note that, in one embodiment, each partial checksum (16 bits) is one-half the size of the data unit (32 bits) from which it is generated. After the partial checksums are determined, they may be stored in memory 706. In one embodiment, the partial checksums determined in one clock cycle are thus available for use by the cumulative checksum generator or the speculative checksum generator in a subsequent clock cycle. The partial checksum generator 704 is further described below.

The cumulative checksum generator 708 may generate a cumulative checksum "C." The cumulative checksum generator 708 may be employed with or in a transmitter or in a receiver. A cumulative checksum C may be generated from one or more of the partial checksums e0, e1, e2, and e3 and a "previously generated" cumulative checksum "c" determined from portions of the message appearing earlier in the input data stream. The partial checksums e0, e1, e2, and e3 may be determined in a previous clock cycle in one embodiment. In addition, the previously generated cumulative checksum c may be determined in the preceding clock cycle and stored in the memory 710 in one embodiment. Accordingly, the cumulative checksum generator 708 may be coupled with and receive partial checksums e0, e1, e2, and e3 stored in the memory 706. In addition, the output of the memory 710, i.e., the previously generated cumulative checksum, may be fed back to the cumulative checksum generator 708. Additionally, the valid and bop flags for an appropriate group data units or clock cycle may be used in determining a cumulative checksum C. The cumulative checksum generator 708 may receive these signals. The cumulative checksum generator 708 is further described below.

The speculative checksum generator 712 may determine if it is necessary to generate a speculative checksum for each time slot, and may store a generated speculative checksum or a not-necessary code in memories 720, 722, 724, and 726. A generated speculative checksum or a not-necessary code may correspond with a like-numbered data unit, e.g., a speculative checksum crc0 or a not-necessary code may correspond with data unit d0. If a time slot includes message data, i.e., the valid flag is set to true (1), a speculative checksum is not needed and not-necessary code is stored for the data unit corresponding with the time slot. On the other hand, it a time slot includes non-message data, i.e., the valid flag is set to false (0), a final checksum may be need and a speculative checksum is generated and stored for the data unit corresponding with the time slot. In one embodiment, a speculative CRC code may be generated from one or more of the partial checksums e0, e1, e2, e3, and the previously generated cumulative checksum c. The partial checksums e0, e1, e2, and e3, and the previously generated cumulative checksum c may be determined in a previous clock cycle in one embodiment. Accordingly, the speculative checksum generator 712 may be coupled with and receive partial checksums e0, e1, e2, and e3. In addition, the speculative checksum generator 712 may be coupled with the output of the memory 710. Additionally, the valid and bop flags for the appropriate group of data units, time slots, or clock cycle may be used in determining a speculative checksum. The speculative checksum generator 712 may receive these signals. The generation of speculative CRC codes is further described below.

The select unit 728 may select one of the speculative checksums crc0, crc1, crc2, and crc3 as the CRC code for a particular message. The select unit 728 may be employed in a receiver. Either the eop or bop signal may be used to select one of the speculative checksums as a CRC code. Accordingly, the select unit 728 may receive the eop or bop signal. Note that more than one message may conclude in a particular clock cycle, and in theses cases, the select unit 728 may select more than one speculative checksums in one clock cycle. In one embodiment, the select unit 728 may select two or more speculative checksums in one clock cycle.

The partial checksum generator 704, the cumulative checksum generator 708, the speculative checksum generator 712, and select unit 728 are now further described.

Partial Checksums

The partial checksum generator 704 may generate a partial checksum from one or more data units. In one embodiment, the partial checksum generator 704 may generate four partial checksums from a group of four data units. The data units in the group may correspond with up to four message segments. The data units in the group that are message segments may or may not all be segments of the same message. The data units in the group may or may not be valid. Each data unit may include first and second components. The partial checksum generator 704 may generate partial checksums e0, e1, e2, and e3 for using the expressions (3)-(10) set forth below, according to one embodiment. In one embodiment, the partial checksum generator 704 may also generate partial checksums for non-message data units, although any partial checksum generated from non-message data is not included in a cumulative or speculative checksum. The first and second components of d0, d1, d2, and d3 in expressions (3)-(10) are denoted as follows: the first and second components of d0 are written d0[0:15] and d0[16:31], where d0[0:15] precedes d0[16:31] in the message. Similarly, the first and second components of d1, d2, and d3 are respectively written as d1[0:15] and d1[16:31], d2[0:15] and d2[16:31], and d3[0:15] and d3[16:31].

If bop[0]=1, $$e0 = M^1 \times d0[16:31] \oplus M^2 \times (\sim \{6'b0, d0[6:15]\}) \quad (3)$$

Else if bop[0]=0, $$e0 = M^1 \times d0[16:31] \oplus M^2 \times d0[0:15] \quad (4)$$

If bop[1]=1, $$e1 = M^1 \times d1[16:31] \oplus M^2 \times (\sim \{6'b0, d1[6:15]\}) \quad (5)$$

Else if bop[1]=0, $$e1 = M^1 \times d1[16:31] \oplus M^2 \times d1[0:15] \quad (6)$$

If bop[2]=1, $$e2 = M^1 \times d2[16:31] \oplus M^2 \times (\sim \{6'b0, d2[6:15]\}) \quad (7)$$

Else if bop[2]=0, $$e2 = M^1 \times d2[16:31] \oplus M^2 \times d2[0:15] \quad (8)$$

If bop[3]=1, $$e3 = M^1 \times d3[16:31] \oplus M^2 \times (\sim \{6'b0, d3[6:15]\}) \quad (9)$$

Else if bop[3]=0, $$e3 = M^1 \times d3[16:31] \oplus M^2 \times d3[0:15] \quad (10)$$

As expressions (3)-(10) show, the form of an expression for a partial checksum depends on whether the particular segment from which it is derived is the initial segment of a message. If the beginning of packet (bop) indicator is equal to one, it indicates that the particular data unit includes a segment that is the first segment of a message. It is necessary to initialize a cumulative checksum calculation at the start of each new message. In one embodiment, initialization may be performed by a partial checksum generator. Initialization may be performed by superimposing an initial value on an initial portion of a new message. The initial value may be, for example, all 1's or all 0's. In expressions (3), (5), (7), and (9), sixteen 1's are superimposed with the first 16 bits of a new message by XORing each message bit with a 1, as indicated by the tilde operation.

In some embodiments, it may be desired to exclude some portion of the bits at the beginning of a message. For instance, SRIO requires exclusion of the first 6 bits from the checksum calculation. For this reason, the first 6 bits of a new message may be replaced by zeros, as indicated by "6'b0" in expressions (3), (5), (7), and (9). Of course, it is not necessary that any part of a new message be excluded from a checksum calculation. In other embodiments, a different number of bits or no bits may be excluded from a checksum calculation.

The partial checksums e0, e1, e2, and e3 correspond with a $32^{nd}$ future state of an LFSR implementing a particular generator polynomial in one embodiment. In each of the expressions (3)-(10), a $16^{th}$ future state vector may be determined from the second (later) component of an input data unit, e.g., d0[16:31], and a $32^{nd}$ future state vector may be determined from the first (earlier) component of the input, e.g., d0[0:15]. In addition, in each of the expressions (3)-(10), the partial checksum is determined by superimposing the $16^{th}$ future state vector derived from the second component and the $32^{nd}$ future state vector derived from the first component, which may be accomplished using an XOR operation. The superposition produces the state of the LFSR after clocking in the $32^{nd}$ bits. Thus, when a 32-bit segment is input to hardware implementing one of the expressions (3)-(10) or a computer having a processor executing a program of instructions that implements one of the expressions (3)-(10), the output corresponds with the state of an LFSR that is obtained after clocking the first 16 bits followed by the second 16 bits through an LFSR in 32 clocks. For example, in the case of expression (3), a second component vector $M^1 \times d0[16:31]$ corresponds with clocking d0[16:31] through 16 clocks of an LFSR, and a first component vector $M^2 \times d0[0:15]$ corresponds with clocking d0[0:15] through 32 clocks of an LFSR. The superposition of these states corresponds with the state of an LFSR that is obtained after clocking the segment d[0:31] through a LFSR in 32 clocks.

In one embodiment, the partial checksum generator 704 may generate and superimpose the first and second vectors substantially simultaneously. In one embodiment, a segment may be an m-bit segment of a message having one or more segments, each segment having first and second n-bit components where m is equal to an integer multiple of n. In one embodiment, the partial checksum generator 704 may generate a partial checksum for each of the four data units d0, d1, d2, and d3. In one embodiment, the partial checksum generator 704 may generate a partial checksum for a single data unit. In some embodiments, the partial checksum generator 704 may generate partial checksums for 2, 4, 8, 16, or 32 data units. It should be understood that partial checksum generator 704 may generate partial checksums for any desired number of data units. Where two or more partial checksums are generated, the partial checksum generator 704 may generate each partial checksum substantially simultaneously or in parallel with the generation of the other partial checksums.

It is not essential that the partial checksum generator 704 generate a partial checksum from two n-bit components of an m-bit segment of a message, where m is equal to an integer multiple of n. In alternative embodiments, more than two components of an m-bit segment of a message may be used in the generation of a partial checksum, e.g., 4, 8, or 16 components. As one non-limiting example, the partial checksum generator 704 may generate a partial checksum from four k-bit segments an m-bit segment of a message, where k is equal to one-fourth of m. As another example, the partial checksum generator 704 may generate a partial checksum from one m-bit component of an m-bit message segment.

One advantage of embodiments according to the principles of the invention is that the initialization of the cumulative checksum calculation at the start of each new message may be performed by the partial checksum generator 704. Conventionally, the initialization of the checksum calculation is performed by loading an initialization value into a cumulative CRC register within a loop that feeds back an intermediate value to be XORed with the each group of message bits. The partial checksum generator 704 may be used to initialize the checksum calculation outside of this critical feedback loop, removing a time-consuming process from the feedback loop.

Another advantage of embodiments according to the principles of the invention is that a message may be divided into segments that are a multiple of the size of the CRC polynomial, e.g., two times the CRC polynomial. This is in contrast to the common practice of dividing a message into portions that are equal to the size of the CRC polynomial. Accordingly, the principles of the invention provide an advantage of enabling the processing more message bits in parallel as compared with known techniques. According to the principles of the invention, there is a recognition that the number of message bits processed in parallel is not inherently related to, or limited by, the size of the CRC polynomial.

Another advantage of embodiments according to the principles of the invention is that two or more partial checksums for two or more segments of a message may be generated in parallel at substantially the same time.

Cumulative Checksum

The length of a message may vary. A particular group of data units may or may not include a segment that is the beginning of a new message. A new cumulative checksum C is started each time an initial segment of a new message is received. In one embodiment, if a group of four data units includes a data unit that is an initial segment of a message, a new cumulative checksum is started; but if the group does not include an initial segment of a message, the current cumulative checksum is continued. A cumulative checksum is generated with the respect to the most recently received message in a group of data units. The most recently received message may be a new message that begins with a data unit in the group that is an initial segment, or a message having its initial segment in a data unit that preceded the group of data units. In one embodiment, a new cumulative checksum C may be started each time the initial segment of a new message is provided for transmission.

In one embodiment, a cumulative checksum C may be generated from one or more of the following inputs: partial checksums e0, e1, e2, and e3 and a previously generated cumulative checksum c. The cumulative checksum generator 708 may determine which of these inputs to include. However, one or more of these inputs may be excluded. In general, an input is included if it is derived from the message for which a particular cumulative checksum is being generated. Conversely, an input is excluded if it is derived from a message other than the message for which the cumulative checksum is being generated, or if it is derived from a non-message data unit. Once a determination has been made to include a particular input, the generation of a cumulative checksum C may include determining how many states to advance the included input. The included input may then be move ahead by the determined number of states.

The valid and bop signals may be used to determine which inputs to include and how many states an input should be moved ahead, as explained below. In addition, notwithstanding that the output of the cumulative checksum generator 708 may be referred to in this description and in the claims as a "cumulative" checksum, for some groups of data units the output may be a final checksum.

Determination of Inputs

With reference to FIG. 7, the cumulative checksum generator 708 preferably includes a selecting part 708a to select one or more inputs to include in the cumulative checksum C such as follows.

A previously generated cumulative checksum c may be included in the determination of a cumulative checksum C if a group of data units does not include a segment that is the first segment of a new message. In contrast, if the group of data units includes a segment that is the first segment of a new message, the previous checksum c is excluded from the determination of the cumulative checksum C.

A partial checksum, e.g., e0, e1, e2, and e3, that was generated from an invalid data unit is excluded from a partial checksum. A partial checksum that was generated from a valid data unit is sometimes, but not always, included in the determination of a cumulative checksum C.

A partial checksum is sometimes, but not always, included in the determination of a cumulative checksum C. In one embodiment, a partial checksum derived from a valid data unit in a group of four data units is excluded in two cases. The group of four data units may include two messages. The cumulative checksum C is generated for most recently received message. In a first case, if either d2 or d3 is the first segment of a message, the partial checksum e0 is excluded even if segment d0 is valid data. Second, if d3 is the first segment of a message, the partial checksum e1 is excluded even if d1 is a valid segment. In these cases, the partial checksum is excluded because it is derived from a message other than the message for which a current cumulative checksum C is being calculated.

Determination of Number of States to Advance an Included Input, and Generation and Superposition of Input Vectors With reference to FIG. 7, the cumulative checksum generator 708 preferably includes a state determining part 708b to determine a number of states to advance, and an input generating part 708c to generate an input vector for advancing by the determined number of states, each input selected by the selecting part 708a, and a superposition part 708d to superimpose the input vectors, such as follows.

Once it is determined that an input should be included in a cumulative checksum, the cumulative checksum generator 708 may determine how many states to advance the included input, and then move the input ahead by the determined number of states. In general, a cumulative checksum is generated with respect to with the most recently received segment of a message. In addition, an included input may be advanced by a number of states proportionate to how many partial checksums are selected for inclusion in the cumulative checksum in a particular iteration. If the included input is a previously generated cumulative checksum, its value is advanced proportionate to the number of partial checksums that are selected for inclusion in the cumulative checksum. If the included input is a particular partial checksum, its value is advanced proportionate to the number of partial checksums that: (a) were selected for inclusion in the cumulative checksum, and (b) that were generated from message segments following the message segment from which the particular partial checksum was generated. Once the number of states to advance an input is determined, an intermediate matrix M raised to a power corresponding with a particular future state of the input may be selected. For example, the intermediate matrix M raised to a power of two may be selected for a particular partial checksum generated from a message segment followed by one other valid segment of the message. An input vector may then be generated by multiplying the included input and the selected intermediate matrix M. These operations may be performed for each included input, and a cumulative checksum may be generated by superimposing the input vectors generated for each of the included inputs.

The table shown in FIG. 8 illustrates the determining of which inputs to include in a cumulative checksum, the determining of how many states to advance the included inputs, the generating of input vectors by moving the included inputs ahead by the determined number of states, and the superposition of the input vectors, according to one embodiment. In an exemplary embodiment, groups of four segments of a message are operated on in parallel, and as such, there are 16 possible cases of valid segments. The 16 possible cases of valid segments may be represented by a truth table in which a "0" or a "1" indicates that a particular segment is invalid or valid, respectively. The four left-most columns of the table of FIG. 8 sets forth this segment valid/invalid truth table. The right-most column sets forth expressions that indicate which inputs are to be included and how many states the included inputs are to be advanced. Various terms in the expressions correspond with input vectors. A cumulative checksum C may be determined by evaluating the expression in the right-most column. The expressions in the tables of FIGS. 8 and 9A-D are in a Verilog format. In particular, a "+" is an XOR operator that superimposes the input vectors when an expression is evaluated. An "x" means matrix multiply, and a "●" refers to an AND operation. A tilde before a beginning of a beginning of message flag signifies that the value of bop is to be inverted. A "16" before a pair of curly braces indicates that the value within the braces is to be replicated 16 times. A pipe symbol "|" before a pair of curly braces indicates that the values within the braces are to be combined in a logical OR operation. A "," is a concatenation operator.

Expressions in the table shown in FIG. 8 may be more fully understood by way of example. As one example, consider the case where none of segments d3, d2, d1 and d0 are valid ("0000"). In this case, the cumulative checksum generator 708 may not change the value stored in the memory 710, that is, $C[0:15] \Leftarrow c[0:15]$. As mentioned, if a previously generated cumulative checksum is selected for inclusion in cumulative checksum, its value is advanced proportionate to the number of partial checksums that are selected for inclusion in the cumulative checksum. Here, the state of the previously generated cumulative checksum is not advanced as there are no partial checksums selected for inclusion.

As an additional example, consider the case where segments d3, d2, d1 and d0 are valid (1111). There are two possible scenarios for this case: the group of segments may or may not include a segment that is the first segment of a new message. First, assume that none of the segments in the group are the first segment of a message. In this case, the cumulative checksum may be given by:

$$C \Leftarrow (M^8 \times c) \oplus (M^6 \times e0) \oplus (M^4 \times e1) \oplus (M^2 \times e2) \oplus e3 \qquad (11)$$

In expression (11), the input vector ($M^8 \times c$) corresponds with clocking a LFSR 128 times from an initial state given by the cumulative checksum c as its present state, wherein the LFSR implements the CRC generator polynomial. The previously generated cumulative checksum is advanced proportionate to the number of partial checksums, in this case four, that were selected for inclusion in the cumulative checksum. The input vector ($M^6 \times e0$) corresponds with clocking the LFSR 96 times with the partial checksum e0 as its input. The partial checksum e0 is advanced proportionate to the number of partial checksums that: (a) were selected for inclusion in the cumulative checksum, and (b) that were generated from message segments following the message segment from which the particular partial checksum was generated. In this case of e0, three partial checksums were selected for inclusion in the cumulative checksum were generated from message segments that follow d0, i.e., d1, d2, and d3. The input vector ($M^4 \times e1$) corresponds with clocking the LFSR 64 times with the partial checksum e1 as its input. The partial checksum e1 is advanced proportionate to a number of states proportionate to how many partial checksums were selected for inclusion in the cumulative checksum that were generated from message segments following the message segment from which e1 was generated. In this case of e1, two partial checksums were selected for inclusion in the cumulative checksum that were generated from message segments that follow d1, i.e., d2 and d3. The input vector ($M^2 \times e2$) corresponds with clocking the LFSR 32 times with the partial checksum e2 as its input. The partial checksum e2 is advanced proportionate to a number of states proportionate to how many partial checksums were selected for inclusion in the cumulative checksum that were generated from message segments following the message segment from which e2 was generated. In this case of e2, one partial checksum was selected for inclusion in the cumulative checksum that was generated from a message segment that follows d2, i.e., d3. Finally, the partial checksum e3 corresponds with clocking the LFSR 32 times with the input data d3 as its input. The partial checksum e3 is advanced proportionate to a number of states proportionate to a number of partial checksums selected for inclusion in the cumulative checksum that were generated from message segments following the message segment from which e3 was generated, i.e. following d3. No partial checksums follow e3 so e3 need not be advanced further. Expression (11) superimposes the input vectors generated from the cumulative checksum c and the partial checksum terms. The result of the superimposition is that the checksum C corresponds with clocking a LFSR 128 times, wherein the LFSR has the cumulative checksum c as its initial state and 1 bit of the 128 bits of d[0:127] are input in each of the 128 clock cycles.

If it is instead assumed in the example (1111) given in the preceding paragraph that that d0 is the first segment of a new message, the expression for the cumulative checksum becomes:

$$C \Leftarrow (M^6 \times e0) \oplus (M^4 \times e1) \oplus (M^2 \times e2) \oplus e3 \qquad (12)$$

The input vectors generated from the partial checksums are the same as before, however, as d0 is the first segment of a message, the previous cumulative checksum c is not included in determining the cumulative checksum C. The previous cumulative checksum c was derived from a message other than the most recently received message for which the cumulative checksum C is being generated.

As may be seen from the table shown in FIG. 8, the number of states to advance a partial checksum may depend on whether the segment from which the partial checksum was derived is the final segment in a group of data units, and the number of valid segments within the group. This reflects the general principle that an included input is advanced in proportion to the position within a message of the segment from which the input is derived.

If a partial checksum is to be included in determining the cumulative checksum C, and if the segment from which the partial checksum was derived is the final valid segment in a group, then the future state for the partial checksum may be determined to be a $32^{nd}$ future state in one embodiment. As each of the partial checksums e0, e1, e2, and e3 corresponds with a $32^{nd}$ future state of an LFSR, a partial checksum derived from the last valid segment in a group may be included in a cumulative checksum determination without further advancing its state. That is, the input vector for a partial checksum derived from a final message segment may be determined by multiplying the partial checksum and an identity matrix. Alternatively, the input vector for the partial checksum may be the partial checksum itself.

If a partial checksum corresponding with a segment is to be included in determining the cumulative checksum C, and if the segment is not the final valid segment in the group, then the future state for the partial checksum may be determined to be a state that is greater than the $32^{nd}$ future state in one embodiment.

As may be also seen from the table shown in FIG. 8, the number of states to advance a previous cumulative checksum c may depend on the number of valid segments in a group of segments. If a previous cumulative checksum c is to be included in determining the cumulative checksum C, and if there is only one valid segment in the group, then the future state for the previous cumulative checksum c may be determined to be a $64^{th}$ future state in one embodiment. In this case, the previous cumulative checksum c may then be moved ahead by 64 states. If a previous cumulative checksum c is to be included in determining the cumulative checksum C, and if there is more than one valid segment in the group, then the future state for the previous cumulative checksum may be determined to be a state that is greater than the $64^{th}$ future state in one embodiment.

As mentioned, a general principle is that an included input is advanced in proportion to the position within a message of the segment from which the input is derived. As the table of FIG. 8 illustrates, when determining the number of states to advance an input to be included in a cumulative checksum C, each valid segment in a group of data units may advance the future state of a partial checksum or previous cumulative checksum by 32 clocks. Conversely, each segment in a group of data units that is not valid does not advance the future state of an included input. For example, consider case (0101): the first and third segments (d0, d2) are valid, but the second and fourth segments (d1, d3) are not valid. Here the state of e0 (corresponding with d0) may be advanced by 32 clocks ($M^2$), while the state of e2 (corresponding with d2) need not be advanced. In contrast, consider case (0111): the first, second, and third segments (d0, d1, d2) are valid, while the fourth segment is not valid. In this instance, the state of e0 (corresponding with d0) may be advanced by 64 clocks ($M^4$), the state of e1 (corresponding with d1) may be advanced by 32 clocks ($M^2$), and the state of e2 (corresponding with d2) need not be advanced.

In addition, if the previously computed checksum c is to be included in determining the cumulative checksum C, its state may be advanced by 32 clocks for each valid segment in the group in one embodiment. For example, in case (0101), if the first and third segments (d0, d2) are valid and the second and fourth segments (d1-d3) are not valid, the state of the cumulative checksum c may be advanced by 64 clocks ($M^4$), as there are two valid segments. Continuing the second example from the preceding paragraph, in case (0111): if the first, second, and third segments (d0, d1, d2) are valid, while the fourth segment is not valid, the state of the cumulative checksum c may be advanced by 96 clocks ($M^6$).

Figure 19:
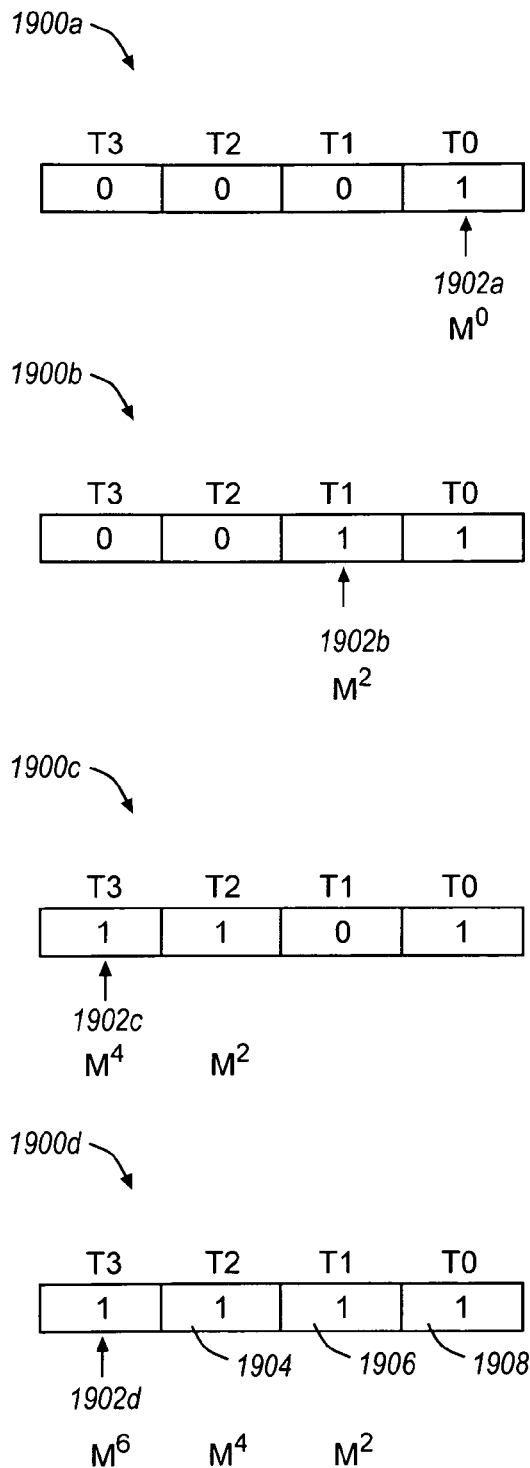
FIG. 19 illustrates instances of a group of four time slots.

FIG. 19 summarizes the principles for advancing an included inputs. FIG. 19 illustrates instances of a group of four sequential time slots 1900. A "1" indicates that the time slot includes a message segment. A "0" indicates that the time slot includes a non-message segment. Reference number 1902 indicates the time slot of the most recently received message segment. A cumulative checksum is generated with respect to a most recently received message segment 1902. For instance, for the group of four time slots 1900a, only time slot T0 includes a valid message segment, and the cumulative checksum is generated with respect to segment 1902a. In contrast, for the group 1900c, the cumulative checksum is generated with respect to message segment 1902c in time slot T3. An included input is advanced by a number of states proportionate to a number of other partial checksums (generated from message segments) in the group of time slots that are selected for inclusion in the cumulative checksum. If the included input is a partial checksum, the "number of other partial checksums" includes only those partial checksums following the segment of the message from which the particular partial checksum was generated. For group 1900a, there are no partial checksums preceding message segment 1902a. The partial checksum generated from message segment 1902a would be advanced by a number of states proportionate to zero other partial checksums. For group 1900d, there are three partial checksum following message segment 1908. The partial checksum generated from message segment 1908 would be advanced by a number of states proportionate to three other partial checksums. Similarly, the partial checksums generated from message segments 1906, 1904, and 1902d would be advanced by numbers of states proportionate to two, one and zero other partial checksums, respectively.

Speculative Checksums

A speculative checksum may be generated for a time slot. A speculative checksum is generated for time slots in cases it where it may be needed. In one embodiment, the apparatus 700 may process 128 bits of data in parallel, which corresponds with a group of four data units in four consecutive time slots. The data units may correspond with up to four message segments, any of which could be the final segment of a message. As mentioned, a receiver of a message from a communications channel conforming to the SRIO protocol does not know in advance the length of the message, and thus does not know the identity of the final segment in advance. The receiver only learns the identity of the final segment of a message in a time slot following the time slot that included the final segment. If a time slot in a group includes the final segment of a message, it is desirable to have the final checksum for that message available for use as soon as possible. The speculative checksum generator 712 may generate a speculative checksum for each time slot in a group that includes a control character indicating that a data unit in a preceding time slot in the group is the final segment of a message. The speculative checksum generator 712 makes a final checksum quickly available.

The generation of a speculative checksum for a time slot generally includes determining if a speculative checksum may be needed, determining one or more inputs to include in the speculative checksum, determining the number of states to advance an included input, generating speculative input vectors, and superimposing the speculative input vectors.

The speculative checksum generator 712 may determine if a speculative checksum may be needed by determining if a time slot includes valid data. If a data unit does not include valid data, then it may include a character indicating that a data unit in a preceding time slot in the group included the final segment of a message. In this case, a speculative checksum is generated for the time slot of the data unit as it may be needed. On the other hand, if a data unit includes valid data, the data unit in the immediately preceding time slot in the group cannot be the final segment of a message under the SRIO protocol. Accordingly, if a data unit includes valid data, it is not necessary to generate a speculative checksum for the time slot of the data unit.

The determination of one or more inputs to include in a speculative checksum is made with respect to a time slot. The determination of which inputs to include is made so as to include all inputs derived from a particular message that were received in time slots preceding the time slot. The inputs may include a previously generated cumulative checksum c and partial checksums derived from the particular message. Accordingly, only a previously generated cumulative checksum c from a preceding clock cycle may be selected for inclusion in the speculative checksum. In addition, only a partial checksum that precedes the time slot for which the speculative checksum is being generated may be selected for inclusion in the speculative checksum. Further, only a partial checksum that was derived from a valid message segment may be selected.

After one or more inputs have been selected to be included in a speculative checksum, the number of states to advance an included input may be determined. Unlike the generation of a cumulative checksum, which is generated with respect to the most recently received message segment, speculative checksums are generated with respect to a particular time slot. An input selected for inclusion in a speculative checksum may be advanced proportionate to how many other checksums are selected for inclusion in the speculative checksum that is being generated for the particular time slot. If the included input is a previously generated cumulative checksum, its value is advanced proportionate to the number of partial checksums that are selected for inclusion in the speculative checksum. If the included input is a particular partial checksum, its value is advanced proportionate to the number of partial checksums that: (a) were selected for inclusion in the speculative checksum, and (b) that were generated from message segments following the message segment from which the particular partial checksum was generated.

Speculative input vectors may be generated and superimposed according to the principles described with respect to generating a cumulative checksum. In particular, an included input may be advanced in proportion to the position in the message of the segment from which the input is derived relative to the time slot for which the speculative checksum is being determined. Once the number of states to advance an input is determined, an intermediate matrix M corresponding with the future state may be selected. A speculative input vector may then be generated by multiplying the included input and the selected intermediate matrix M. These operations may be replicated for each included input, and a speculative checksum may be generated by superimposing the input vectors for each of the included inputs.

Speculative checksums generated by the speculative checksum generator 712 may be stored in memories 720, 722, 724, and 726. Each of the memories 720, 722, 724, and 726 corresponds with a time slot. If a data unit in a time slot does not include valid data, a speculative checksum is stored in the corresponding memory. On the other hand, if a data unit in a time slot includes valid data, a speculative checksum for the time slot will not be generated by the speculative checksum generator. In one embodiment, a "not necessary" code may be stored in the memory corresponding with a time slot that included valid data.

FIGS. 9A-D show a table illustrating the generation of a speculative checksums for a variety of different cases of valid inputs according to one embodiment. In an exemplary embodiment, groups of four segments of a message are operated on in parallel, and as such, there are 16 possible cases of valid segments. The 16 possible cases of valid segments may be represented by a truth table in which a "0" or a "1" indicates that a particular segment is invalid or valid, respectively. The four left-most columns of the table of FIGS. 9A-D sets forth this segment valid/invalid truth table. The right-most column sets forth the expressions for generating speculative checksums. For each case, expressions for each of the four speculative checksums, crc0, crc1, crc2, and crc3 are provided. The expressions in the table of FIGS. 9A-D indicate which inputs are to be included in a speculative checksum and how many states included inputs are to be advanced. In some cases, a "not necessary" code may be assigned to a time slot. The expressions in the table of FIGS. 9A-D are in a Verilog format.

As may be seen from the table of FIGS. 9A-D, an operation to select one or more inputs to include in a speculative checksum may include selecting one or more partial checksums and a previously generated cumulative checksum c. In one embodiment, the partial checksum e3 corresponding with the fourth time slot is never selected for inclusion a speculative checksum. The partial checksum e3 is not selected because a speculative checksum for a particular message is associated with a time slot following the time slot in which the final segment of the message was received, and the time slot following the fourth time slot of a group is the first time slot in the next group. The partial checksum e3 may be included in a speculative checksum for one of the time slots in the next group by inclusion of a previously generated cumulative checksum c.

As may be seen from the table of FIGS. 9A-D, the generation of a speculative checksum for a time slot includes selecting one or more inputs to include in the speculative checksum. The speculative checksum generator 712 may select a previously generated cumulative checksum for inclusion in the speculative checksum for a particular time slot if none of the time slots in the group preceding the particular time slot includes a data unit that is an initial segment of a message. Similarly, the speculative checksum generator 712 may select a partial checksum for inclusion in the speculative checksum for a particular time slot if none of the time slots preceding the particular time slot includes a data unit that is an initial segment of a message.

In cases where one or more of the time slots in the group preceding a particular time slot may include a data unit that is an initial segment of a message, the speculative checksum generator 712 may select a partial checksum for inclusion in the speculative checksum for a particular time slot if (a) the partial checksum is generated from message data of a second time slot, (b) the particular time slot follows the second time slot, and (c) the second time slot includes a time slot having a data unit that includes the initial segment of a message.

In the shown embodiment, there are five cases in which the time slot for which the speculative checksum is generated is preceded by two or more valid message segments: 0011, 0101, 0110, 0111, and 1011. If the time slot for which the speculative checksum is generated is preceded by two or more valid message segments, the partial checksums corresponding with the message segments may be selected for inclusion in a speculative checksum provided none of the two or more message segments are an initial segment of a new message. However, if only one of the two or more message segments are an initial segment of a new message, the partial checksums corresponding with the initial message segment and each subsequent message segment may be selected for inclusion in a speculative checksum. In addition, if two of the two or more message segments are an initial segment of a new message, the partial checksums corresponding with the second initial message segment and each subsequent message segment may be selected for inclusion in a speculative checksum.

Once the number of states to advance an input to be included in a speculative checksum is determined, a speculative input vector may be generated for each included input. An intermediate matrix M raised to a power corresponding with a particular future state of the input may be selected. A speculative input vector may then be generated by multiplying the included input and the selected intermediate matrix M. For example, referring to the table shown in FIGS. 9A-D, the expressions for crc0, crc1, and crc2 for the case 0001 include the speculative input vectors ($M^2 \times c$), and ($M^0 \times e0$) or simply e0. After the speculative input vectors are generated, a speculative checksum may be generated by superimposing the speculative input vectors. The "+" operators signify that speculative input vectors are superimposed when an expression is evaluated.

Speculative Checksum Selection

In one embodiment, the apparatus 700 may process a group of four data units in parallel. If the group does not include a message segment that is an initial segment of a new message, there is no need to determine a final checksum for the group. The inclusion of an initial message segment in a group of data units may imply that a preceding data unit in the group is a final segment of a message. However, if the group includes a message segment that is an initial segment of a new message, there is a need to determine at least one final checksum for the group. Thus, where a group includes an initial message segment, at least one speculative checksum may be selected as a final checksum of a preceding message in order to determine whether the message was transmitted without error. In one embodiment, a select unit 728 may be employed for selecting a speculative checksum as a final checksum for one or more messages in a group.

In one embodiment, the select unit 728 may select a speculative checksum as a final checksum based on the eop signal. First, if none of the double words d0, d1, d2, and d3 are the last double word of a message, none of the speculative checksums are selected. If d0 is the last double word of a message, speculative checksum crc1 may be selected. If d1 is the last double word of a message, speculative checksum crc2 may be selected. If d2 is the last double word of a message, speculative checksum crc3 may be selected. If d3 is the last double word of a message, this may not be known until the next clock cycle. If d3 is the last double word of a message, the speculative checksum crc0 may be selected in the next clock cycle. As mentioned, two speculative checksums may be selected in one clock cycle if two of the double words in a group are the last double words of respective messages.

Figure 10:
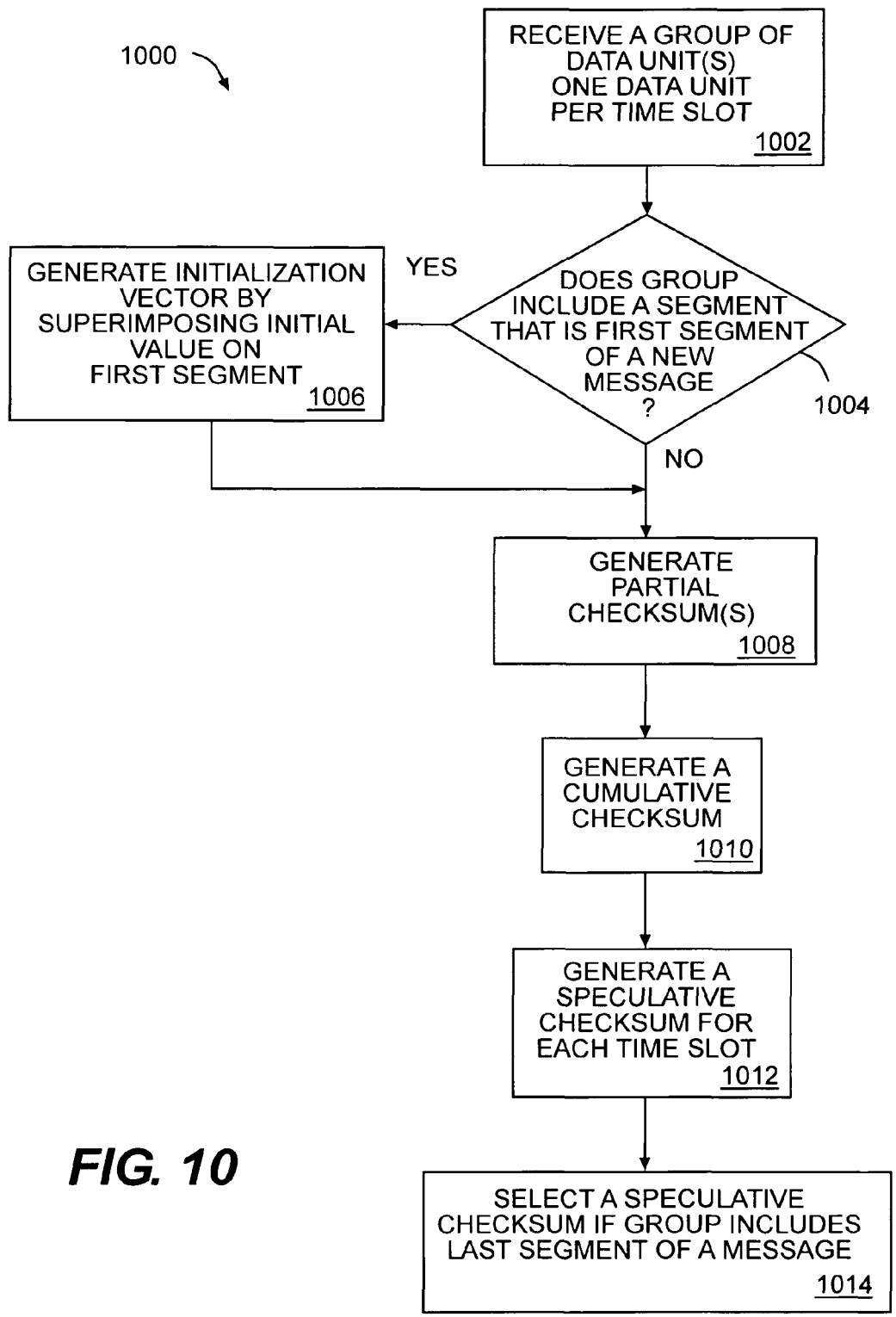
FIG. 10 is a flow diagram of a method for detecting message transmission errors in a communications channel according to one embodiment.

FIG. 10 is a flow diagram showing a method 1000 for detecting message transmission errors in a communications channel according to an exemplary embodiment. The method 1000 may be used for determining whether a message transmitted in the communications channel is received without error. In addition, all or a portion of the method 1000 may be used for generating a checksum for a message to be transmitted in the communications channel. Any one operation of method 1000 shown in the flow diagram of FIG. 10 may itself include one or more operations, which are illustrated in FIGS. 11-16.

The method 1000 may be used with a communications channel having a sequence of time slots. A unit of data may be transmitted or received in a time slot, or otherwise associated with a time slot. A data unit may be non-message data or message data. Note that an SIRO time slot, as used herein, may correspond with more than one SRIO bus clock cycle. In one embodiment, an SRIO time slot may correspond with a time period needed to transmit four characters. The method 1000 may operate on messages having one or more segments. A message data unit may be a message segment.

In one embodiment, the method 1000 may include receiving one or more messages. The receiving of messages may include receiving a group of one or more data units from the communications channel (operation 1002). Alternatively, the receiving of messages may include receiving a group of one or more data units to be transmitted on the communications channel. The group of one or more data units may be transmitted, received, or otherwise associated with a corresponding group of one or more time slots of a communications channel. The data units of a group may be received or transmitted in consecutive time slots. In one embodiment, a group of data units includes four data units and a corresponding group of time slots includes four time slots. It is not essential, however, that a group of data units includes four data units and a corresponding group of time slots includes four time slots. In alternative embodiments, any desired number of data units or time slots may be included in a group, e.g., 1, 2, 4, 8, or 16. The method 1000 may include determining whether a message segment is an initial segment of a message (operation 1004). The operation 1004 may include determining whether a group of data units or segments includes a data unit that is an initial segment of a message. If it is determined that a message segment is the first segment of a new message, an initialization vector may be generated by superimposing the initial segment (or a portion of the initial segment) and an initialization value (operation 1006).

Figure 11:
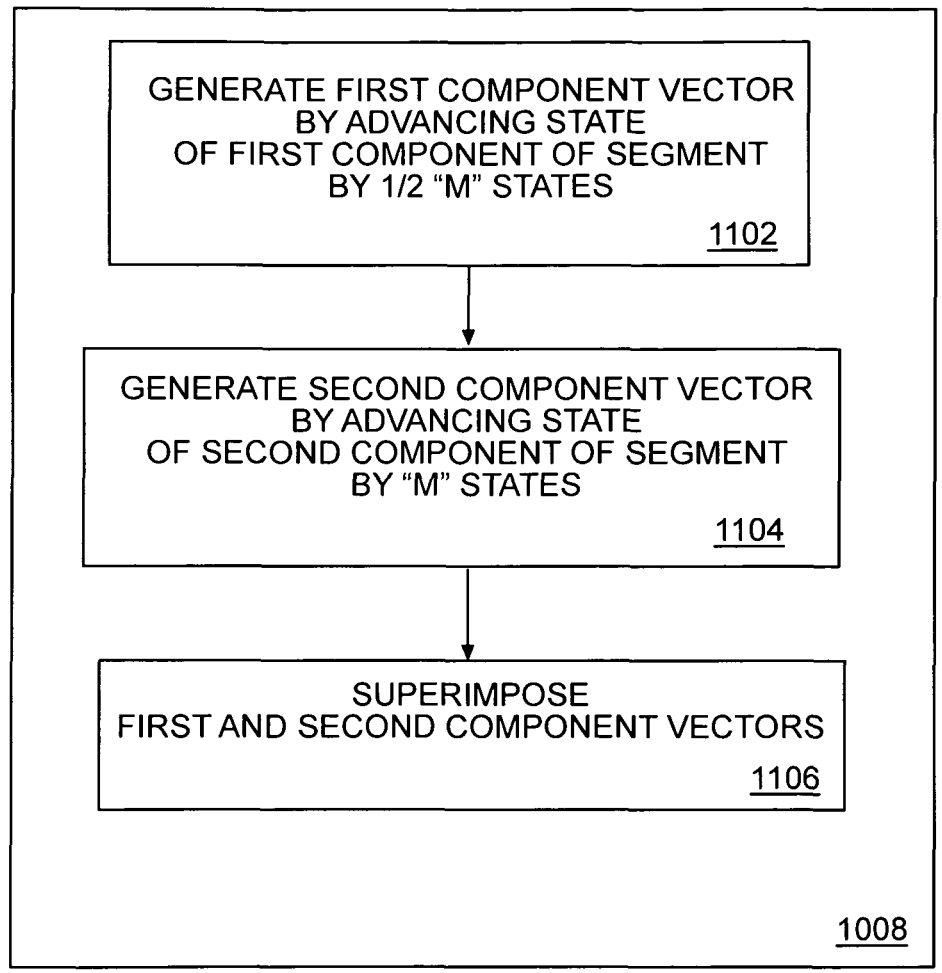
FIG. 11 is a flow diagram of a method for generating a partial checksum from a message segment according to one embodiment.

The method 1000 may include generating a partial checksum for each segment of a message (operation 1008). The operation 1008 may include generating a partial checksum for each data unit in a group of data units, or generating a partial checksum for each message segment in a group of message segments. Alternatively, operation 1008 may include generating a partial checksum for each message data unit in a group of data units. A partial checksum may be generated by advancing the state of a corresponding segment of a message. In one embodiment, a cumulative checksum and a partial checksum may both be n bits and the partial checksum may be generated from a corresponding n-bit message segment by advancing the message segment by n states. In an alternative embodiment, a cumulative checksum and a partial checksum may both be n bits and the partial checksum may be generated from a corresponding m-bit message segment by advancing the message segment by m states, m being equal to an integer multiple of n. Referring to FIG. 11, a partial checksum may be generated from a corresponding m-bit message segment by generating a first component vector by advancing a first component of the message by n states (operation 1102), generating a second component vector by advancing a second component of the message by m states, m being equal to an integer multiple of n (operation 1104), and superimposing the first and second component vectors (operation 1106). The cumulative checksum may be n bits. In one embodiment, the generating of a partial checksum for each segment of a message may include generating a group of four partial checksums.

Figure 12:
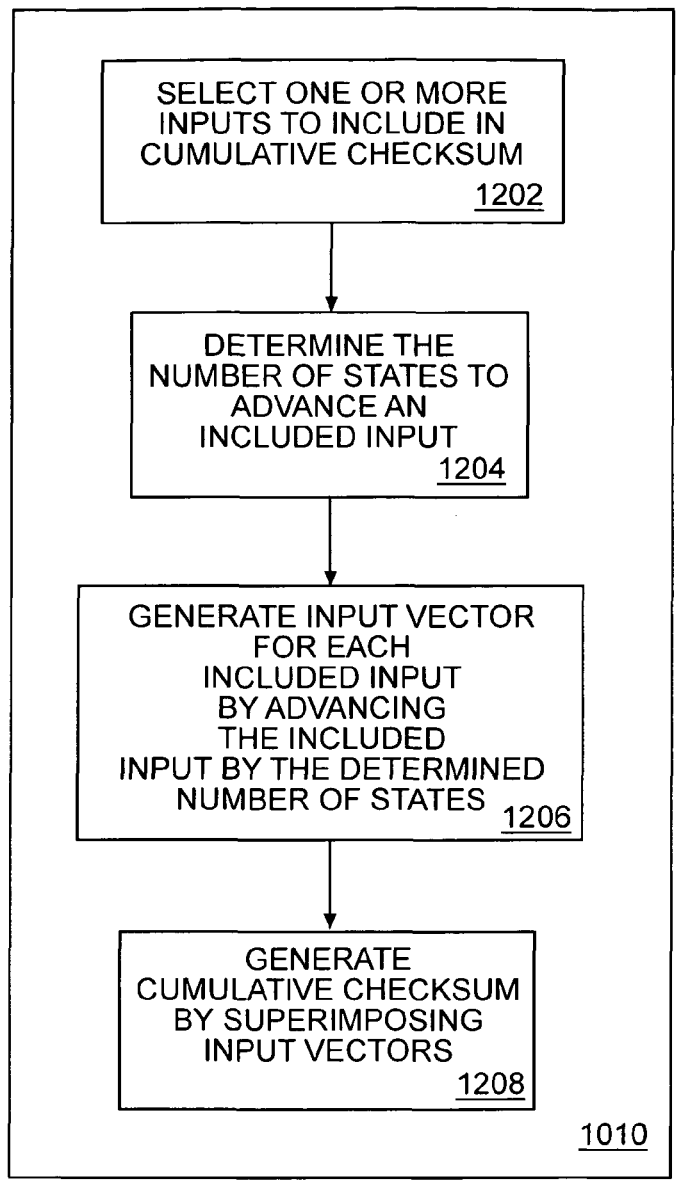
FIG. 12 is a flow diagram of a method for generating of a cumulative checksum according to one embodiment.

Referring again to FIG. 10, the method 1000 may include generating a cumulative checksum (operation 1010). The cumulative checksum may be generated for any message transmitted in or received from a communications channel. In addition, a cumulative checksum may be generated more than one time for a message. The cumulative checksum generated in operation 1010 may be n bits. Referring to FIG. 12, the generating of a cumulative checksum may include: (a) selecting one or more inputs to include in the cumulative checksum (operation 1202); (b) determining the number of states to advance an input selected for inclusion in the cumulative checksum (operation 1204); (c) generating an input vector for each input selected for inclusion in the cumulative checksum by advancing the selected input by the determined number of states (operation 1206); and (d) superimposing the input vectors (operation 1208). With regard to operation 1202, the selecting of one or more inputs to include in the cumulative checksum, the inputs may be selected from a previously generated cumulative checksum and a group of one or more partial checksums.

Figure 13:
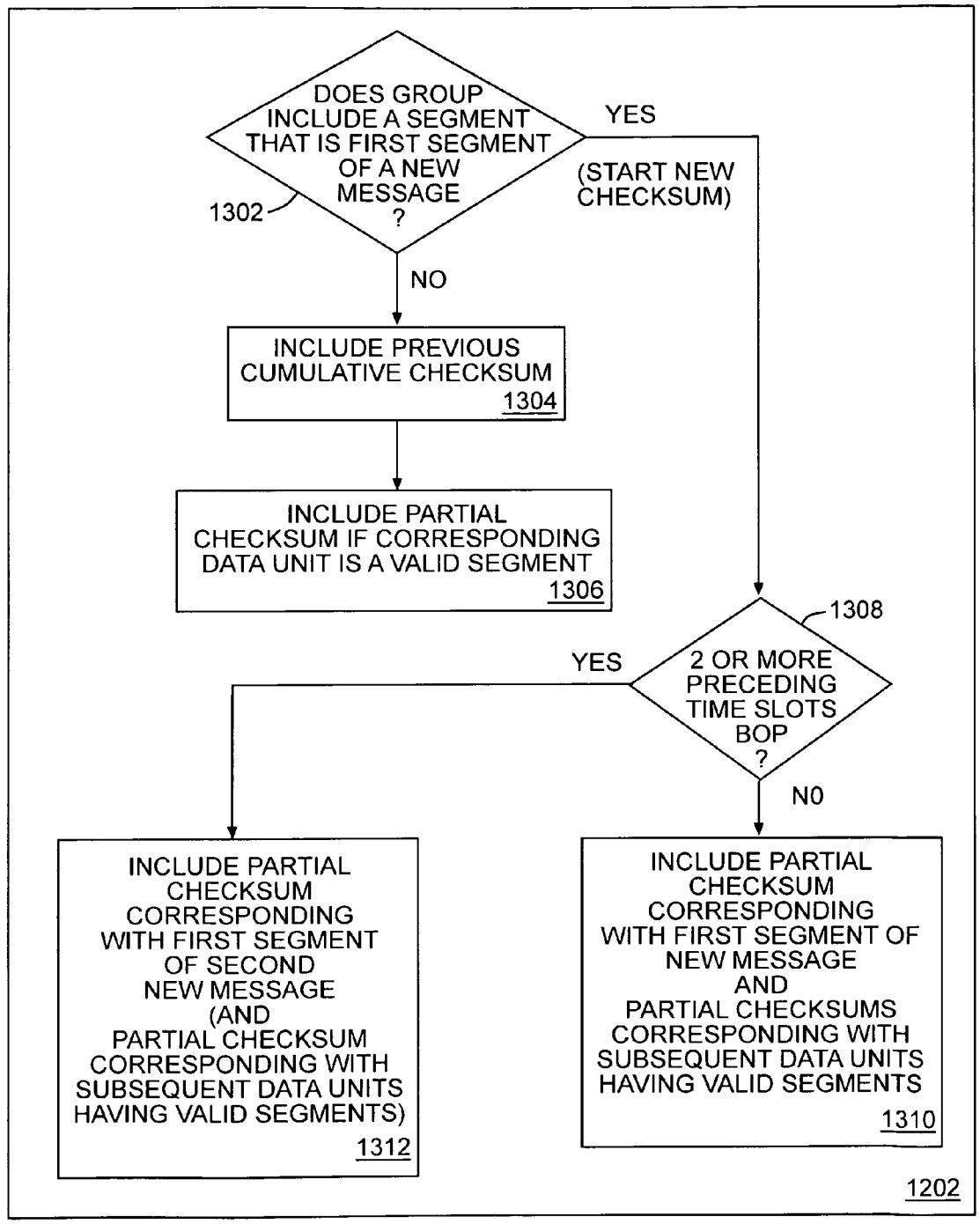
FIG. 13 is a flow diagram of a method for selecting of one or more inputs to include in a cumulative checksum according to one embodiment.

Referring to FIG. 13, an exemplary operation 1202 is shown in which it is assumed that a group includes four checksums, although it is not essential that the group include four checksums. The selecting of one or more inputs to include in the cumulative checksum may include determining if a data unit or segment from which a partial checksum in a group of one or more checksums was generated is an initial segment of a message (operation 1302). If none of the segments in the group is the first segment of a message, the method proceeds to an operation 1304 in which a previously generated cumulative checksum is selected for inclusion in the cumulative checksum. The method then proceeds to an operation 1306 in which one or more partial checksums in the group may be selected for inclusion in the cumulative checksum. In operation 1306, a partial checksum may be selected for inclusion if the data unit from which it was generated includes message data, and may be excluded if generated from a non-message data unit. On the other hand, if one of the segments is the first segment of a message, the method proceeds from operation 1302 to an operation 1308, where a new cumulative checksum is started. In operation 1308, it may be determined whether the group of checksums includes more than one checksum that was generated from an initial segment of a message. If only one of the checksums was generated from an initial segment of a message, the method advances to operation 1310. Otherwise, the method proceeds to operation 1312. In operation 1310, a partial checksum may be selected for inclusion in the cumulative checksum if the partial checksum was generated from the initial segment of a new message, or if the partial checksum was generated from a segment following the initial segment of the new message. Operation 1312 addresses the case where there may be two initial message segments in a group of data units, e.g., an initial message segment for a preceding or first message and an initial message segment for a following or second message. In general, a cumulative checksum is generated with the respect to the most recently received message in a group of data units. Accordingly, a partial checksum may be selected for inclusion in the cumulative checksum if the particular partial checksum was generated from the initial segment of the following message, or if the particular partial checksum was generated from a segment following the initial segment of the following message. Conversely, if a particular partial checksum was generated from a segment that precedes the initial segment of the following message, the partial checksum is not selected for inclusion in the cumulative checksum. While FIG. 13 refers to an exemplary operation 1202 in which it is assumed that a group includes four checksums, one of ordinary skill in the art will understand that the operation 1202 may be adapted to accommodate groups of other sizes.

Referring to FIG. 12, the determining the number of states to advance an input selected for inclusion in the cumulative checksum (operation 1204) may include determining to advance the input by a number of states proportionate to how many partial checksums in a group of partial checksums are selected for inclusion in the cumulative checksum. If the included input is a particular partial checksum, the operation 1204 may include determining to advance the particular partial checksum generated from a particular segment of a message by a number of states proportionate to the number of other partial checksums selected for inclusion in the cumulative checksum that were generated from segments of the message that follow the particular segment. If the included input is a previously generated cumulative checksum, the operation 1204 may include determining to advance the previously generated cumulative checksum by a number of states proportionate to the number of partial checksums selected for inclusion in the cumulative checksum. In one embodiment, the operation 1204 may include determining to advance a particular partial checksum by m states for each other partial checksum selected for inclusion in the cumulative checksum that was generated from a message segment following the particular message segment from which the particular partial checksum was generated, wherein the selected partial checksums were generated from m-bit message segments. In one embodiment, the operation 1204 may include determining to advance the previously generated cumulative checksum by m states for each partial checksum selected for inclusion in the cumulative checksum, wherein the selected partial checksums were generated from m-bit message segments.

Figure 14:
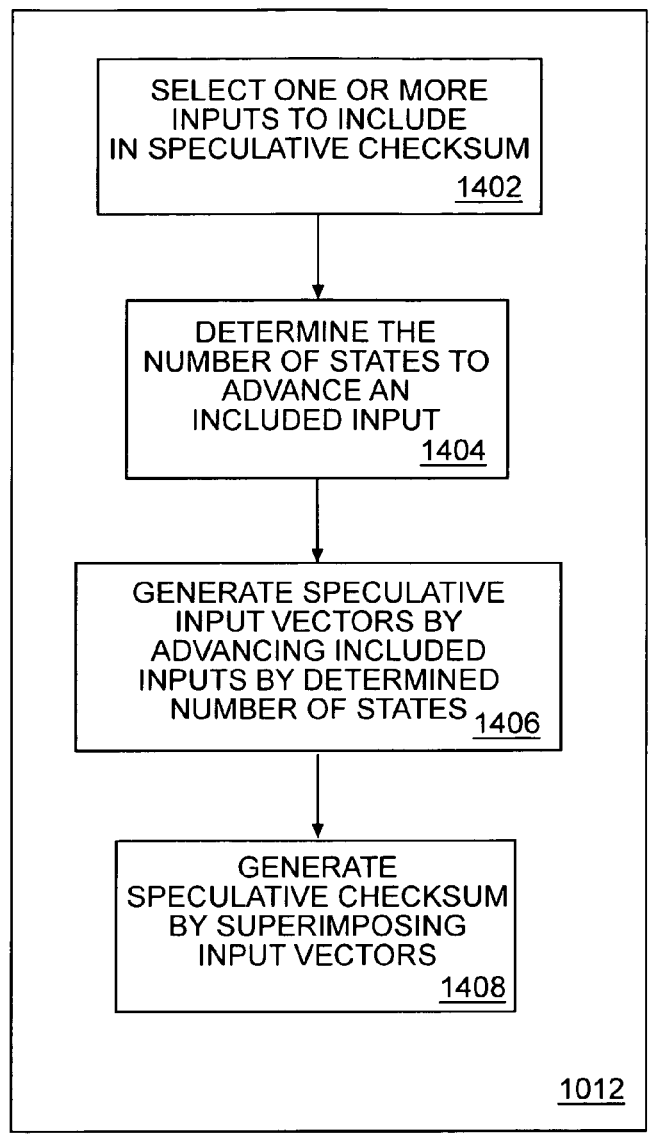
FIG. 14 is a flow diagram of a method for generating one or more speculative checksums for each time slot of a communications channel in which a data unit may be communicated according to one embodiment.

Referring to FIG. 10, the method 1000 may include generating one or more speculative checksums in one embodiment. A speculative checksum may be generated for each time slot of the communications channel in which a data unit may be communicated (operation 1012). In alternative embodiments, the operation 1012 may include generating a speculative checksum for each segment of a group of message segments, for each data unit of a group of data units, or for each time slot of a group of time slots. Referring to FIG. 14, the operation 1012 may include: (a) selecting one or more inputs to include in the speculative checksum (operation 1402); (b) determining the number of states to advance an input selected for inclusion in the speculative checksum (operation 1404); (c) generating a speculative input vector for each input selected for inclusion in the speculative checksum by advancing the selected input by the determined number of states (operation 1406); and (d) superimposing the speculative input vectors (operation 1408).

The selecting of one or more inputs to include in a speculative checksum for a particular time slot (operation 1402) may include selecting the previously generated cumulative checksum for inclusion in the speculative checksum if (a) none of the time slots in the group of one or more time slots preceding the particular time slot includes a data unit that is an initial segment of a message, and (b) the particular time slot includes a data unit that is not a segment of a message.

The operation 1402 may also include selecting a partial checksum for inclusion in the speculative checksum if (a) none of the time slots in the group of one or more time slots preceding the particular time slot includes a data unit that is an initial segment of a message, and (b) the particular time slot includes a data unit that is not a segment of a message.

Additionally, the operation 1402 may address the case where there may be two message segments in a group of data units that are the initial segments of messages, i.e., an initial message segment for a preceding or first message, and an initial message segment for a following or second message. The operation 1402 may include selecting a partial checksum for inclusion in a speculative checksum for a particular time slot: if the particular partial checksum was generated from the initial segment of the following message, or if the particular partial checksum was generated from a segment following the initial segment of the following message. Conversely, if a particular partial checksum was generated from a segment that precedes the initial segment of the following message, the partial checksum is not selected for inclusion in the cumulative checksum.

Figure 15:
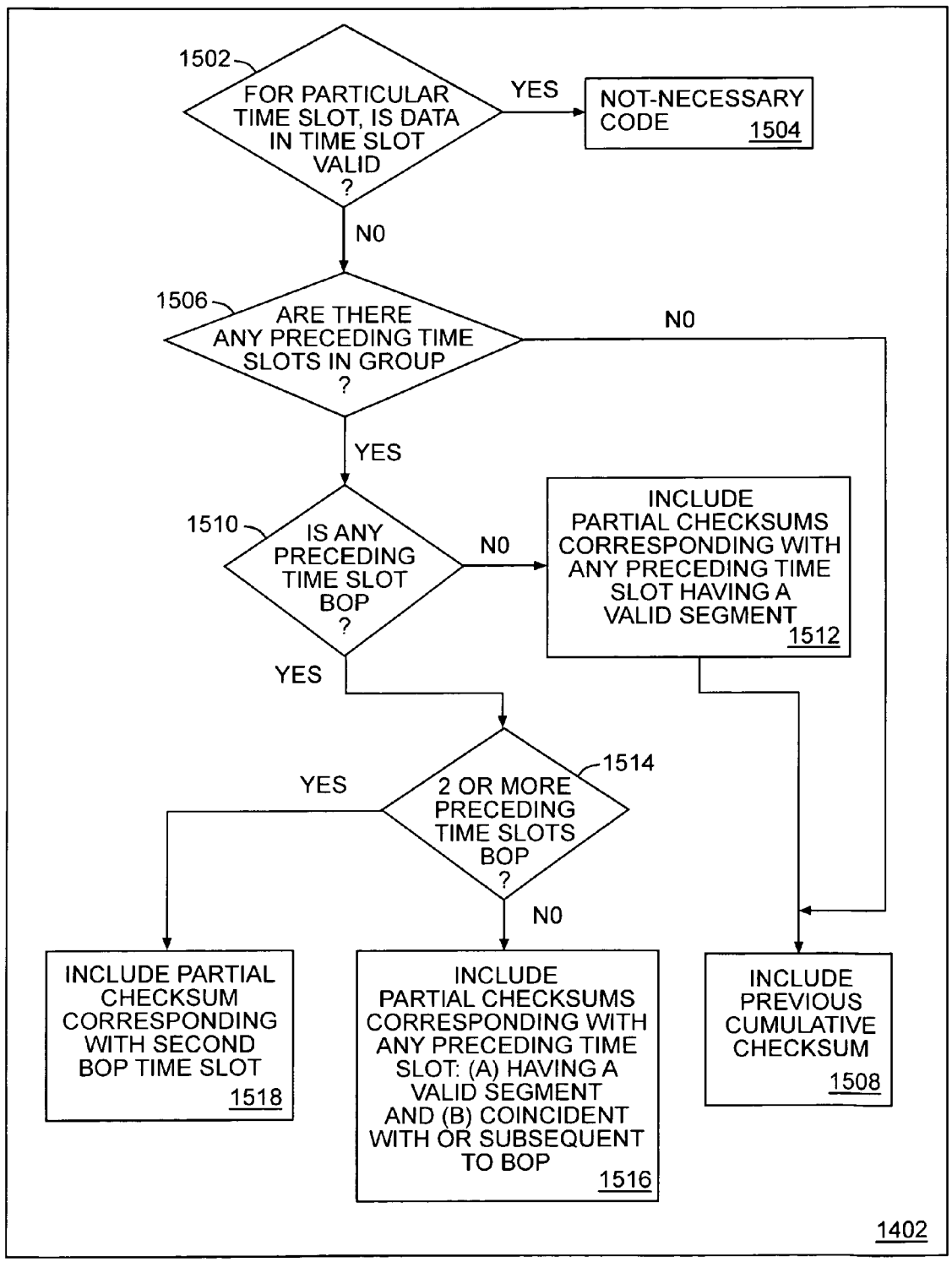
FIG. 15 is a flow diagram of a method for selecting one or more inputs to include in a speculative checksum according to one embodiment.

FIG. 15 is a flow diagram of a method for selecting one or more inputs to include in a speculative checksum for a particular time slot according to one embodiment. In operation 1502, it may be determined if the data unit associated with a time slot is message data. If the data unit includes message data, the not-necessary code may be generated for the time slot (operation 1504). If the data unit does not include message data, it may be determined if there are any of the time slots preceding the time slot for which the speculative checksum is being generated (operation 1506). If the time slot for which the speculative checksum is being generated is the earliest time slot in the group, the previously generated cumulative checksum may be selected for inclusion in the speculative checksum (operation 1508). On the other hand, if the time slot for which the speculative checksum is being generated is not the earliest time slot in the group, it may be determined if any time slot preceding the time slot for which the speculative checksum is being generated includes an initial segment of a message (operation 1510). If no time slot preceding the particular time slot for which the speculative checksum is being generated includes an initial segment of a message, a partial checksum generated from a time slot preceding the particular time slot may be selected for inclusion in the speculative checksum so long as the partial checksum was generated from message data (operation 1512). If a time slot preceding the particular time slot for which the speculative checksum is being generated includes an initial segment of a message, it may be determined if there is only one time slot preceding the particular time slot that includes the initial segment of a message (operation 1514). If there is only one time slot preceding the particular time slot that includes an initial segment of a message, a partial checksum may be selected for inclusion in the speculative checksum if the partial checksum was generated from message data, and if the partial checksum was generated from a data unit of the time slot that included the initial segment of the message, or from a data unit of a time slot subsequent to the time slot that included the initial segment but prior to the particular time slot (operation 1516). If there are two time slots in the group of time slots that include an initial segment of a message, there will be an initial segment of a preceding message and an initial segment of a following message. A partial checksum may be selected for inclusion in the speculative checksum if the partial checksum was generated from message data, and if the partial checksum was generated from a data unit of a time slot that included a segment of the following message (operation 1518).

Figure 16:
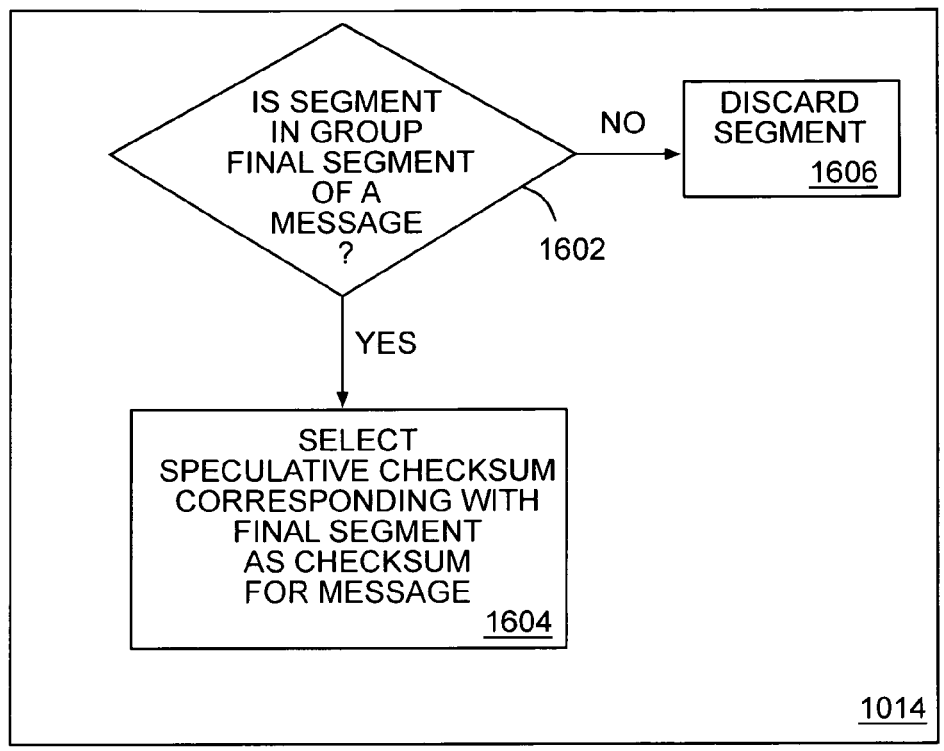
FIG. 16 is a flow diagram of a method for selecting a speculative checksum according to one embodiment.

Referring again to FIG. 10, the method 1000 may include selecting a "first speculative checksum" for use in determining whether the message was transmitted without error if the first speculative checksum was generated for a time slot following a final segment of a message (operation 1014). FIG. 16 is a flow diagram of a method for selecting a speculative checksum according to one embodiment. The method may be performed for each time slot in a group of time slots in one embodiment. In operation 1602, it may be determined if a segment in a particular time slot is a final segment of a message. If a speculative checksum was generated for a time slot that corresponds with a final segment of a message, the speculative checksum may be selected, for example, for use in determining if a message was transmitted without error (operation 1604). It should be appreciated that for some sequences of messages, more than one speculative checksum may be selected if the group of time slots includes more than one segment that is the last segment of a message. For example, a group of four time slots may include the final segments of first and second messages. In this situation, two speculative checksums may be selected as final checksums for two messages in one clock cycle. On the other hand, if a speculative checksum was generated for a time slot that does not correspond with a final segment of a message, the speculative checksum may be discarded (operation 1606).

Figure 17:
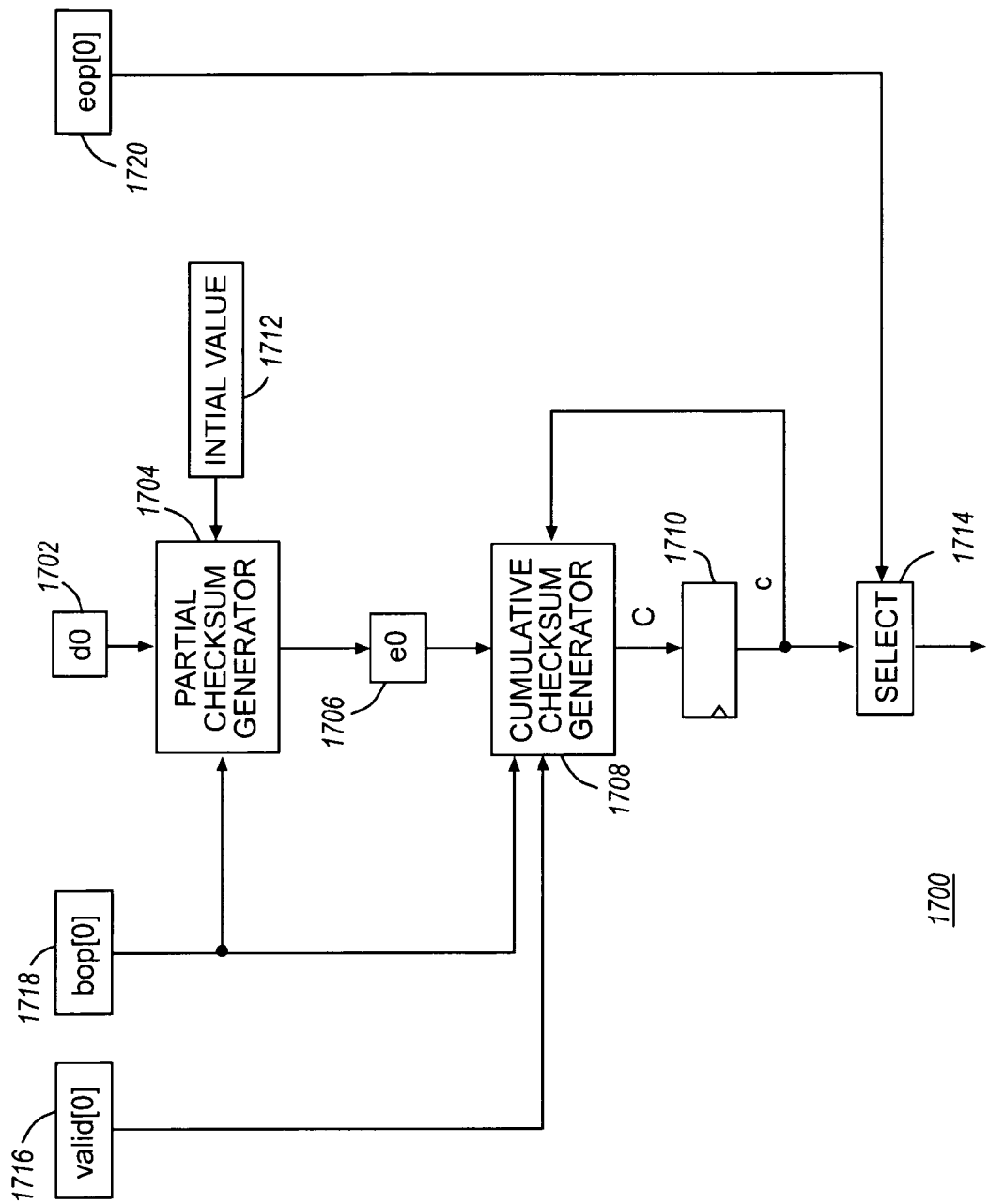
FIG. 17 is a block diagram of an apparatus for speed-optimized computation of CRC codes according to one alternative embodiment.

FIG. 17 is a block diagram of an apparatus 1700 for speed-optimized computation of CRC codes according to an alternative embodiment. The exemplary apparatus 1700 may process 32 bits of input data in parallel, computing CRC codes using any 16 degree generator polynomial. Note that 32 bits is two times the degree of the generator polynomial. In one alternative, the apparatus 1700 may process 16 bits of input data in parallel, computing CRC codes using any 16 degree generator polynomial. The exemplary apparatus 1700 may include a memory 1702 for storing input data, a partial checksum generator 1704 for generating a partial checksum from the input data, and a memory 1706 for storing the partial checksum. In addition, the apparatus 1700 may include a cumulative checksum generator 1708 for generating a cumulative checksum and a memory 1710 for storing a cumulative checksum. The apparatus 1700 may also include a select apparatus 714 for selecting a cumulative checksum as a CRC code for a particular message. Additionally, memories 1720, 1716, and 1718 may be provided for storing eop, valid, and bop flags, respectively. A memory 1712 may be provided with the apparatus 700 for storing an initialization value. An advantage of the apparatus 1700 is that the initialization of the cumulative checksum calculation at the start of each new message may be performed by the partial checksum generator 1704, removing a time-consuming process from the cumulative checksum generator feedback loop. Another advantage of the apparatus 1700 is that twice the number of message bits may be processed in parallel as compared with known techniques.

Figure 18:
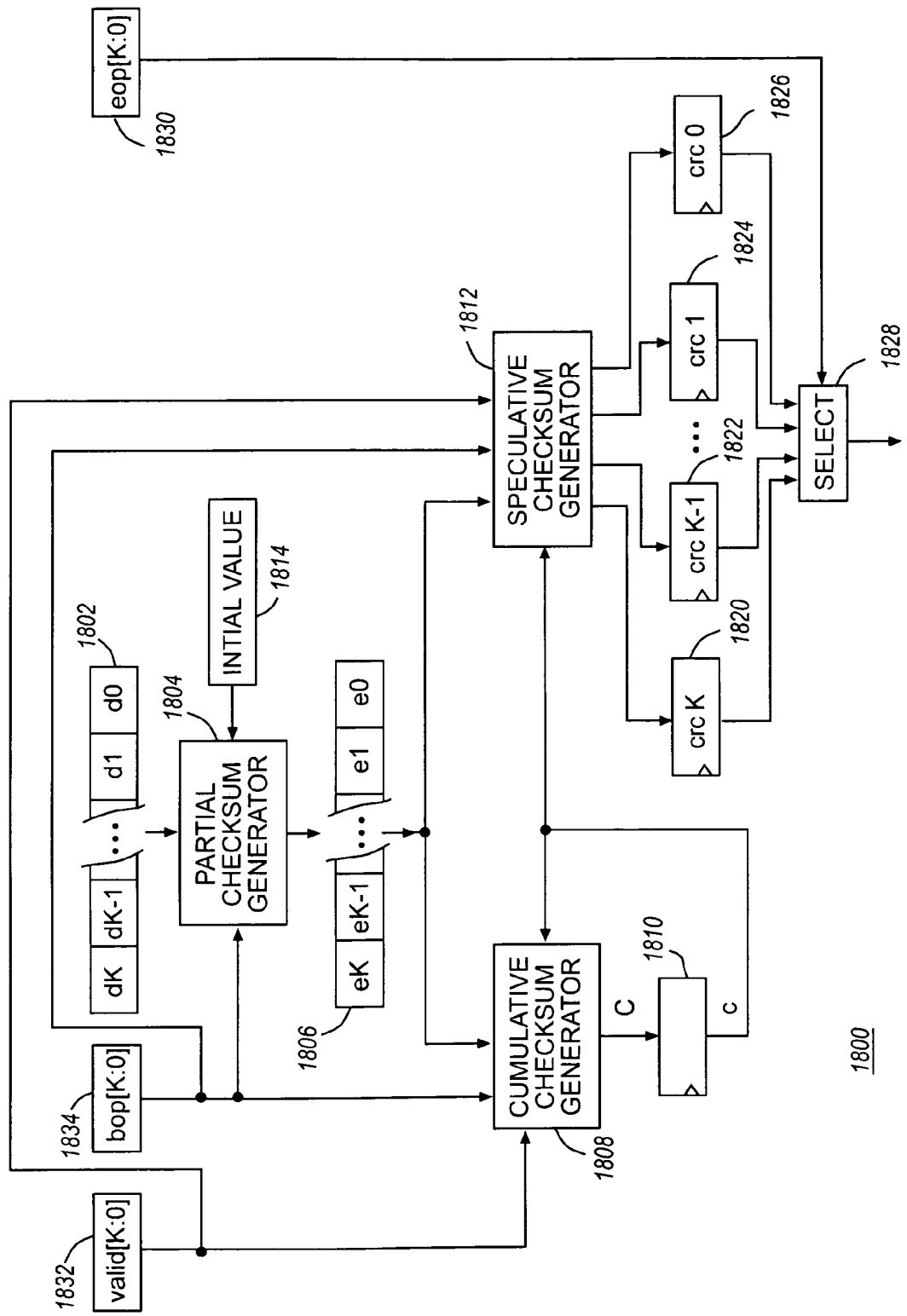
FIG. 18 is a block diagram of an apparatus for speed-optimized computation of CRC codes according to another alternative embodiment.

FIG. 18 is a block diagram of an apparatus 1800 for speed-optimized computation of CRC codes according to an alternative embodiment. The exemplary apparatus 1800 may process j bits of input data in parallel, where j=k×32 bits; k=1, 2, 3, . . . , n, in one embodiment. The exemplary apparatus 1800 may compute CRC codes using any 16 degree generator polynomial in one embodiment. The exemplary apparatus 1800 may include a memory 1802 for storing k message segments of input data, a partial checksum generator 1804 for generating k partial checksums from the input data, and a memory 1806 for storing the partial checksums. In some embodiments, k=2, 8, 16, or 32. In addition, the apparatus 1800 may include a cumulative checksum generator 1808 for generating a cumulative checksum and a memory 1810 for storing a cumulative checksum. Further, the apparatus 1800 may include a speculative checksum generator 1812 for generating k speculative checksums and memories for storing k speculative checksums (or not-necessary codes), such as the memories 1820, 1822, 1824, and 1826. Additional speculative checksums memories may be provided as needed. The apparatus 1800 may also include a select apparatus 1828 for selecting a speculative checksum as a CRC code for a particular message. Additionally, memories 1830, 1832, and 1834 may be provided for storing eop, valid, and bop flags, respectively. A memory 1814 may be provided with the 1800 for storing an initialization value.

The embodiments for computation of cyclic redundancy check codes have been described above in the context of logical expressions. While these logical expressions may be implemented in hardware, the applicability of the described techniques is not limited to hardware; the techniques may be implemented in software, or a combination of hardware and software. In some embodiments, some or all of the operations and methods described in this description may be performed in a programmable logic device (PLD), complex programmable logic device (CPLD), field-programmable gate array (FPGA), or other similar device that has been programmed using a JEDEC or other similar file developed from instructions written in a hardware definition language, such as VHDL or Verilog. In one embodiment, some or all of the operations and methods described in this description may be performed in an application specific integrated circuit (ASIC). In one embodiment, some or all of the operations and methods described in this description may be performed by a processor, such as a CPU or DSP, executing a program of instructions that may be stored in a memory, such that when the processor executes the instructions it performs one or more of the operations or steps described herein.

In one embodiment, some or all of the operations and methods described in this description may be performed by executing instructions that are stored in or on a non-transitory computer-readable medium. The term "computer-readable medium" may include, but is not limited to, non-volatile memories, such as EPROMs, EEPROMs, ROMs, floppy disks, hard disks, flash memory, and optical media such as CD-ROMs and DVDs. The instructions may be executed by any suitable apparatus, e.g., a central processing unit, digital signal processor, system-on-a-chip, or other processor. When the instructions are executed, the apparatus performs physical machine operations.

In this description, references may be made to "one embodiment" or "an embodiment." These references mean that a particular feature, structure, or characteristic described in connection with the embodiment is included in at least one embodiment of the claimed inventions. Thus, the phrases "in one embodiment" or "an embodiment" in various places are not necessarily all referring to the same embodiment. Furthermore, particular features, structures, or characteristics may be combined in one or more embodiments.

Although embodiments have been described in some detail for purposes of clarity of understanding, it will be apparent that certain changes and modifications may be practiced within the scope of the appended claims. Accordingly, the described embodiments are to be considered as illustrative and not restrictive, and the claimed inventions are not to be limited to the details given herein, but may be modified within the scope and equivalents of the appended claims. Further, the terms and expressions which have been employed in the foregoing specification are used as terms of description and not of limitation, and there is no intention in the use of such terms and expressions to exclude equivalents of the features shown and described or portions thereof, it being recognized that the scope of the inventions are defined and limited only by the claims which follow.

The invention claimed is:

1. An apparatus for generating checksums for detecting message transmission errors in a communications channel having time slots for transmitting units of data, the messages having one or more message segments, the apparatus comprising:
   a cumulative checksum generator to generate a cumulative checksum for a message, the cumulative checksum generator including:
      a selecting part to select one or more inputs to include in the cumulative checksum, the inputs being selected from a previously generated cumulative checksum and one or more partial checksums;
      a state determining part to determine a number of states to advance an input selected for inclusion in the cumulative checksum;
      an input vector generating part to generate an input vector for each input selected for inclusion in the cumulative checksum by advancing the selected input by the determined number of states; and
      a superposition part to superimpose the input vectors.

2. The apparatus of claim 1, further comprising a partial checksum generator to generate the one or more partial checksums from one or more respective message segments, wherein a partial checksum corresponding with an initial segment of the message is generated from at least an initialization vector, the initialization vector being generated by superimposing the initial segment and an initialization value.

3. The apparatus of claim 1, further comprising a partial checksum generator to generate the one or more partial checksums, each partial checksum being generated by advancing the state of a corresponding segment of the message.

4. The apparatus of claim 1, further comprising a partial checksum generator to generate the one or more partial checksums from one or more respective message segments, wherein the cumulative checksum is n bits, each partial checksum is n bits and is generated from a corresponding n-bit segment of the message by advancing the segment by n states.

5. The apparatus of claim 1, further comprising a partial checksum generator to generate the one or more partial checksums from one or more respective message segments, wherein the cumulative checksum is n bits, each partial checksum is n bits and is generated from a corresponding m-bit segment of the message by advancing the segment by m states, m being equal to an integer multiple of n.

6. The apparatus of claim 1, further comprising a partial checksum generator to generate one or more partial checksums, wherein the cumulative checksum is n bits, each partial checksum is generated from a corresponding m-bit message segment of the message by generating a first component vector by advancing a first component of the message by n states, generating a second component vector by advancing a second component of the message by m states, and superimposing the first and second component vectors, m being equal to an integer multiple of n.

7. The apparatus of claim 6, wherein the one or more partial checksums includes four partial checksums.

8. The apparatus of claim 6, further comprising:
   a speculative checksum generator to generate a speculative checksum for each of one or more time slots, the speculative checksum generator including:
      a selecting component to select one or more inputs to include in the speculative checksum, the inputs being selected from the previously generated cumulative checksum and the one or more partial checksums;
      a state determining component to determine a number of states to advance an input selected for inclusion in the speculative checksum;
      a generating component to generate a speculative input vector for each input selected for inclusion in the speculative checksum by advancing the selected input by the determined number of states; and
      a superimposing component to superimpose the speculative input vectors; and
   a speculative checksum selector to select a first speculative checksum for use in determining whether the message was transmitted without error if the first speculative checksum was generated for a time slot following a final segment of the message.

9. The apparatus of claim 1, wherein the selecting part:
   selects the previously generated cumulative checksum for inclusion in the cumulative checksum if the previously generated cumulative checksum was generated from the message, and otherwise excludes the previously generated cumulative checksum from the cumulative checksum.

10. The apparatus of claim 1, wherein the selecting part:
   selects a partial checksum for inclusion in the cumulative checksum if the partial checksum was generated from a segment of the message, and otherwise excludes the previously generated cumulative checksum from the cumulative checksum.

11. The apparatus of claim 1, further comprising a receiver to receive the message and a checksum generated for the message from the communications channel.

12. The apparatus of claim 1, wherein the state determining part:
   determines to advance a particular partial checksum by a number of states proportionate to a number of other partial checksums of the one or more partial checksums selected for inclusion in the cumulative checksum that were generated from segments of the message following a segment of the message from which the particular partial checksum was generated.

13. The apparatus of claim 1, wherein the state determining part:
   determines to advance the previously generated cumulative checksum by a number of states proportionate to a number of partial checksums of the one or more partial checksums selected for inclusion in the cumulative checksum.

14. The apparatus of claim 1, wherein each unit of data is one of a message data unit or a non-message data unit, further comprising:
   a speculative checksum generator to generate a speculative checksum for each of one or more time slots, the speculative checksum generator including:
      a selecting component to select one or more inputs to include in the speculative checksum, the inputs being selected from the previously generated cumulative checksum and the one or more partial checksums;
      a state determining component to determine a number of states to advance an input selected for inclusion in the speculative checksum;
      a generating component to generate a speculative input vector for each input selected for inclusion in the speculative checksum by advancing the selected input by the determined number of states; and
      a superimposing component to superimpose the speculative input vectors.

15. The apparatus of claim 14, wherein the selecting component:
   selects the previously generated cumulative checksum for inclusion in the speculative checksum for a particular time slot if none of the one or more time slots preceding the particular time slot includes a data unit that is an initial segment of a message, and the particular time slot includes a non-message data unit.

16. The apparatus of claim 15, wherein the selecting component:
   selects a particular partial checksum for inclusion in the speculative checksum for a particular time slot if none of the one or more time slots preceding the particular time slot includes a data unit that is an initial segment of a message, and the particular time slot includes a non-message data unit.

17. The apparatus of claim 15 wherein, the selecting component:
   selects a particular partial checksum for inclusion in the speculative checksum for a particular time slot if one of the one or more time slots includes a time slot having a data unit that is an initial segment of a message, the time slot having the data unit that is an initial segment of a message precedes the particular time slot, and the particular time slot includes a non-message data unit.

18. The apparatus of claim 15, wherein the state determining component:
   determines to advance a particular partial checksum by a number of states proportionate to a number of other partial checksums of the one or more partial checksums selected for inclusion in the speculative checksum that were generated from segments of the message following a segment of the message from which the particular partial checksum was generated.

19. The apparatus of claim 15, wherein the state determining component:
   determines to advance the previously generated cumulative checksum by a number of states proportionate to a number of partial checksums of the one or more partial checksums selected for inclusion in the speculative checksum.

20. The apparatus of claim 15, further comprising a speculative checksum selector to select a first speculative checksum for use in determining whether the message was transmitted without error if the first speculative checksum was generated for a time slot following a final segment of a message.

21. A method for detecting message transmission errors in a communications channel having time slots for transmitting units of data, the messages having one or more message segments, the method comprising:
   generating a cumulative checksum for a message, the generating of the cumulative checksum including:
      selecting one or more inputs to include in the cumulative checksum, the inputs being selected from a previously generated cumulative checksum and one or more partial checksums;
      determining a number of states to advance an input selected for inclusion in the cumulative checksum;
      generating an input vector for each input selected for inclusion in the cumulative checksum by advancing the selected input by the determined number of states; and
      superimposing the input vectors.

22. The method of claim 21, further comprising generating the one or more partial checksums from one or more respective message segments, wherein a partial checksum corresponding with an initial segment of the message is generated from at least an initialization vector, the initialization vector being generated by superimposing the initial segment and an initialization value.

23. The method of claim 21, further comprising generating the one or more partial checksums, each partial checksum being generated by advancing the state of a corresponding segment of the message.

24. The method of claim 21, further comprising generating the one or more partial checksums from one or more respective message segments, wherein the cumulative checksum is n bits, each partial checksum is n bits and is generated from a corresponding n-bit segment of the message by advancing the segment by n states.

25. The method of claim 21, further comprising generating the one or more partial checksums from one or more respective message segments, wherein the cumulative checksum is n bits, each partial checksum is n bits and is generated from a corresponding m-bit segment of the message by advancing the segment by m states, m being equal to an integer multiple of n.

26. The method of claim 21, further comprising generating one or more partial checksums, wherein the cumulative checksum is n bits, each partial checksum is generated from a corresponding m-bit segment of the message by generating a first component vector by advancing a first component of the message by n states, generating a second component vector by advancing a second component of the message by m states, and superimposing the first and second component vectors, m being equal to an integer multiple of n.

27. The method of claim 26, wherein the one or more partial checksums includes four partial checksums.

28. The method of claim 21, wherein the selecting of one or more inputs to include in the cumulative checksum includes:
selecting the previously generated cumulative checksum for inclusion in the cumulative checksum if the previously generated cumulative checksum was generated from the message, and otherwise excluding the previously generated cumulative checksum from the cumulative checksum.

29. The method of claim 21, wherein the selecting of one or more inputs to include in the cumulative checksum includes:
selecting a partial checksum for inclusion in the cumulative checksum if the partial checksum was generated from a segment of the message, and otherwise excludes the previously generated cumulative checksum from the cumulative checksum.

30. The method of claim 21, further comprising receiving the message and a checksum generated for the message from the communications channel.

31. The method of claim 21, wherein the determining a number of states to advance an included input includes:
determining to advance a particular partial checksum by a number of states proportionate to a number of other partial checksums of the one or more partial checksums selected for inclusion in the cumulative checksum that were generated from segments of the message following a segment of the message from which the particular partial checksum was generated.

32. The method of claim 21, wherein the determining a number of states to advance an included input includes:
determining to advance the previously generated cumulative checksum by a number of states proportionate to a number of partial checksums of the one or more partial checksums selected for inclusion in the cumulative checksum.

33. The method of claim 21, further comprising transmitting the message and a checksum generated for the message in the communications channel.

34. The method of claim 21, wherein each unit of data is one of a message data unit or non-message data unit, further comprising:
generating a speculative checksum for each of one or more time slots, the generating of a speculative checksum including:
selecting one or more inputs to include in the speculative checksum, the inputs being selected from the previously generated cumulative checksum and the one or more partial checksums;
determining a number of states to advance an input selected for inclusion in the speculative checksum;
generating a speculative input vector for each input selected for inclusion in the speculative checksum by advancing the selected input by the determined number of states; and
superimposing the speculative input vectors.

35. The method of claim 34, wherein the selecting of one or more inputs to include in a speculative checksum includes:
selecting the previously generated cumulative checksum for inclusion in the speculative checksum for a particular time slot if none of the one or more time slots preceding the particular time slot includes a data unit that is an initial segment of a message, and the particular time slot includes a non-message data unit.

36. The method of claim 34, wherein the selecting of one or more inputs to include in a speculative checksum includes:
selecting a particular partial checksum for inclusion in the speculative checksum for a particular time slot if none of the time slots of one or more time slots preceding the particular time slot includes a data unit that is an initial segment of a message, and the particular time slot includes a non-message data unit.

37. The method of claim 34, wherein the selecting of one or more inputs to include in a speculative checksum includes:
selecting a particular partial checksum for inclusion in the speculative checksum for a particular time slot if one of the one or more time slots includes a time slot having a data unit that is an initial segment of a message, wherein the time slot having the data unit that is an initial segment of a message precedes the particular time slot, and the particular time slot includes a non-message data unit.

38. The method of claim 34, wherein the determining the number of states to advance an input selected for inclusion in the speculative checksum includes:
determining to advance a particular partial checksum by a number of states proportionate to a number of other partial checksums of the one or more partial checksums selected for inclusion in the speculative checksum that were generated from segments of the message following a segment of the message from which the particular partial checksum was generated.

39. The method of claim 34, wherein the determining the number of states to advance an input selected for inclusion in the speculative checksum includes:
determining to advance the previously generated cumulative checksum by a number of states proportionate to a number of partial checksums of the one or more partial checksums selected for inclusion in the speculative checksum.

40. The method of claim 34, further comprising selecting a first speculative checksum for use in determining whether the message was transmitted without error if the first speculative checksum was generated for a time slot following a final segment of a message.

* * * * *